United States Patent
Hirano et al.

(10) Patent No.: US 11,452,201 B2
(45) Date of Patent: Sep. 20, 2022

(54) ELECTRONIC DEVICE AND CONNECTING COMPONENT

(71) Applicant: SONY CORPORATION, Tokyo (JP)

(72) Inventors: Keiichi Hirano, Tokyo (JP); Akihiro Horii, Tokyo (JP); Yoshiyuki Nomura, Tokyo (JP); Keiji Niina, Tokyo (JP); Kosuke Sakazume, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 17/287,140

(22) PCT Filed: Sep. 5, 2019

(86) PCT No.: PCT/JP2019/034917
§ 371 (c)(1),
(2) Date: Apr. 21, 2021

(87) PCT Pub. No.: WO2020/090224
PCT Pub. Date: May 7, 2020

(65) Prior Publication Data
US 2021/0392740 A1 Dec. 16, 2021

(30) Foreign Application Priority Data

Oct. 30, 2018 (JP) .............................. JP2018-204248
Mar. 29, 2019 (JP) .............................. JP2019-068591

(51) Int. Cl.
*H05K 1/02* (2006.01)
(52) U.S. Cl.
CPC ........... *H05K 1/0228* (2013.01); *H05K 1/028* (2013.01)
(58) Field of Classification Search
CPC .......... H05K 1/14; H05K 1/144; H05K 1/145; H05K 1/16; H05K 1/18; H05K 1/181;
(Continued)

(56) References Cited

U.S. PATENT DOCUMENTS 5,971,804 A * 10/1999 Gallagher ............. G06F 13/409
333/246
6,597,062 B1 * 7/2003 Li ........................... H05K 1/144
257/777
(Continued)

FOREIGN PATENT DOCUMENTS

CN 101416567 A 4/2009
JP 2005-183410 A 7/2005
(Continued)

OTHER PUBLICATIONS

JP-2005183410-A Translation (Year: 2021).*
(Continued)

*Primary Examiner* — Hoa C Nguyen
*Assistant Examiner* — John B Freal
(74) *Attorney, Agent, or Firm* — Chip Law Group

(57) ABSTRACT

To provide an electronic device and a connecting component which have a shield function and which enable downsizing. The electronic device includes: a substrate having a first substrate portion and a second substrate portion that is arranged at a position facing the first substrate portion; a plurality of potential wirings which are connected to the first substrate portion and to the second substrate portion and which have an arbitrary potential; and a plurality of signal wirings which are connected to the first substrate portion and to the second substrate portion and to which a signal is supplied. The first substrate portion has a mounting region of an electronic component on a side of a surface facing the second substrate portion. The plurality of potential wirings are arranged outside of the mounting region.

14 Claims, 32 Drawing Sheets

(58) Field of Classification Search
CPC .... H05K 1/0228; H05K 1/023; H05K 5/0021; H05K 5/0026; H05K 5/0065; H05K 5/0069; H05K 5/0247; H05K 5/0256; H05K 7/14; H05K 7/142; H05K 7/1428; H05K 7/18
See application file for complete search history.

(56) References Cited

U.S. PATENT DOCUMENTS

| | | | |
|---|---|---|---|
| 2002/0075096 A1* | 6/2002 | Anthony | H01G 4/012 |
| | | | 333/167 |
| 2003/0040166 A1* | 2/2003 | Moshayedi | H05K 1/181 |
| | | | 257/E23.079 |
| 2009/0321122 A1 | 12/2009 | Mori et al. | |
| 2016/0050750 A1* | 2/2016 | Rogers | H05K 3/285 |
| | | | 361/767 |

FOREIGN PATENT DOCUMENTS

| | | | |
|---|---|---|---|
| JP | 2005183410 A | * | 7/2005 |
| JP | 2015-053298 A | | 3/2015 |
| JP | 2016-082021 A | | 5/2016 |
| WO | 2007/116657 A1 | | 10/2007 |

OTHER PUBLICATIONS

International Search Report and Written Opinion of PCT Application No. PCT/JP2019/034917, dated Oct. 8, 2019, 07 pages of ISRWO.

* cited by examiner

ELECTRONIC DEVICE AND CONNECTING COMPONENT

CROSS REFERENCE TO RELATED APPLICATIONS

This application is a U.S. National Phase of International Patent Application No. PCT/JP2019/034917 filed on Sep. 5, 2019, which claims priority benefit of Japanese Patent Application No. 2019-068591 filed in the Japan Patent Office on Mar. 29, 2019 and also which claims priority benefit of Japanese Patent Application No. JP 2018-204248 filed in the Japan Patent Office on Oct. 30, 2018. Each of the above-referenced applications is hereby incorporated herein by reference in its entirety.

TECHNICAL FIELD

The present disclosure relates to an electronic device and a connecting component.

BACKGROUND ART

Electronic devices are known in which an electronic component is covered by a metallic shield case in order to prevent electromagnetic waves from penetrating to the electronic component from outside of the shield case and prevent electromagnetic waves from leaking to the outside of the shield case from the electronic component. In addition, a technique for shielding electromagnetic waves using a shield portion that is formed when manufacturing a circuit board instead of a metallic shield case is known (for example, refer to PTL 1).

CITATION LIST

Patent Literature

[PTL 1]
JP 2015-53298 A

SUMMARY

Technical Problem

Further downsizing of electronic devices having a function for shielding electromagnetic waves (hereinafter, a shield function) is desired.

The present disclosure has been made in consideration of such circumstances and an object thereof is to provide an electronic device and a connecting component which have a shield function and which enable downsizing.

Solution to Problem

An aspect of the present disclosure is an electronic device, including: a substrate having a first substrate portion and a second substrate portion that is arranged at a position facing the first substrate portion; a plurality of potential wirings which are connected to the first substrate portion and to the second substrate portion and which have an arbitrary potential; and a plurality of signal wirings which are connected to the first substrate portion and to the second substrate portion and to which a signal is supplied, wherein the first substrate portion has a mounting region of an electronic component on a side of a surface facing the second substrate portion. Accordingly, a circuit board with a stack structure in which the first substrate portion and the second substrate portion are connected by a connecting component is constructed. In addition, the plurality of arbitrary potential wirings function as a shield that shields electromagnetic waves. Furthermore, shield members (the plurality of arbitrary potential wirings) are arranged in a region for establishing continuity (an electrical connection) between the first substrate portion and the second substrate portion. Accordingly, potential wirings that function as a shield and signal wirings can be arranged at a narrow pitch of, for example, 0.3 mm. For this reason, a multi-applicable electromagnetic shield not realizable with a conventional metal-plate shield case can now be realized and can make a significant contribution toward downsizing. Therefore, the electronic device can be downsized.

Another aspect of the present disclosure is a connecting component to be arranged between a first substrate portion and a second substrate portion that face each other, the connecting component including: a base material having a first surface and a second surface that is arranged on a side opposite to the first surface; a plurality of potential wirings which are provided inside the base material and which have an arbitrary potential; and a plurality of signal wirings which are provided inside the base material and to which a signal is supplied, wherein one end of the potential wirings and one end of the signal wirings are respectively exposed from the first surface and another end of the potential wirings and another end of the signal wirings are respectively exposed from the second surface. Accordingly, the one end of the potential wirings and the one end of the signal wirings can be connected to the first substrate portion. The other end of the potential wirings and the other end of the signal wirings can be connected to the second substrate portion. The plurality of potential wirings function as a shield that shields electromagnetic waves. In addition, shield members (the plurality of potential wirings) are arranged in a region for establishing continuity (an electrical connection) between the first substrate portion and the second substrate portion. Accordingly, the connecting component enables downsizing of the electronic device.

DESCRIPTION OF EMBODIMENTS

Hereinafter, an embodiment of the present disclosure will be described with reference to drawings. In the descriptions of the drawings to be referred to hereinafter, same or similar portions are denoted by same or similar reference signs. However, it should be noted that the drawings are schematic and relationships between thicknesses and plan view dimensions, ratios of thicknesses of respective layers, and the like differ from those in reality. Therefore, specific thicknesses and dimensions should be determined by taking the following description into consideration. In addition, it is needless to say that the drawings include portions where dimensional relationships and ratios differ among the drawings.

In addition, it is to be understood that definitions of directions such as up-down in the following description are merely definitions provided for the sake of brevity and are not intended to limit the technical ideas of the present disclosure. For example, it is obvious that when an object is observed after being rotated by 90 degrees, up-down is converted into and interpreted as left-right, and when an object is observed after being rotated by 180 degrees, up-down is interpreted as being inverted.

Furthermore, in the following description, a direction may be explaining using the terms X-axis direction, Y-axis direction, and Z-axis direction. For example, the X-axis direction and the Y-axis direction are directions that are parallel to an upper surface 10a of a first substrate 10 to be described later. The Z-axis direction is a normal direction of the upper surface 10a of the first substrate 10. The Z-axis direction and the X-axis direction are orthogonal to each other and the Y-axis direction and the Z-axis direction are orthogonal to each other. Moreover, in the following description, "in a plan view" refers to viewing from the normal direction of the upper surface 10a of the first substrate 10 (in other words, the Z-axis direction).

Figure 1:
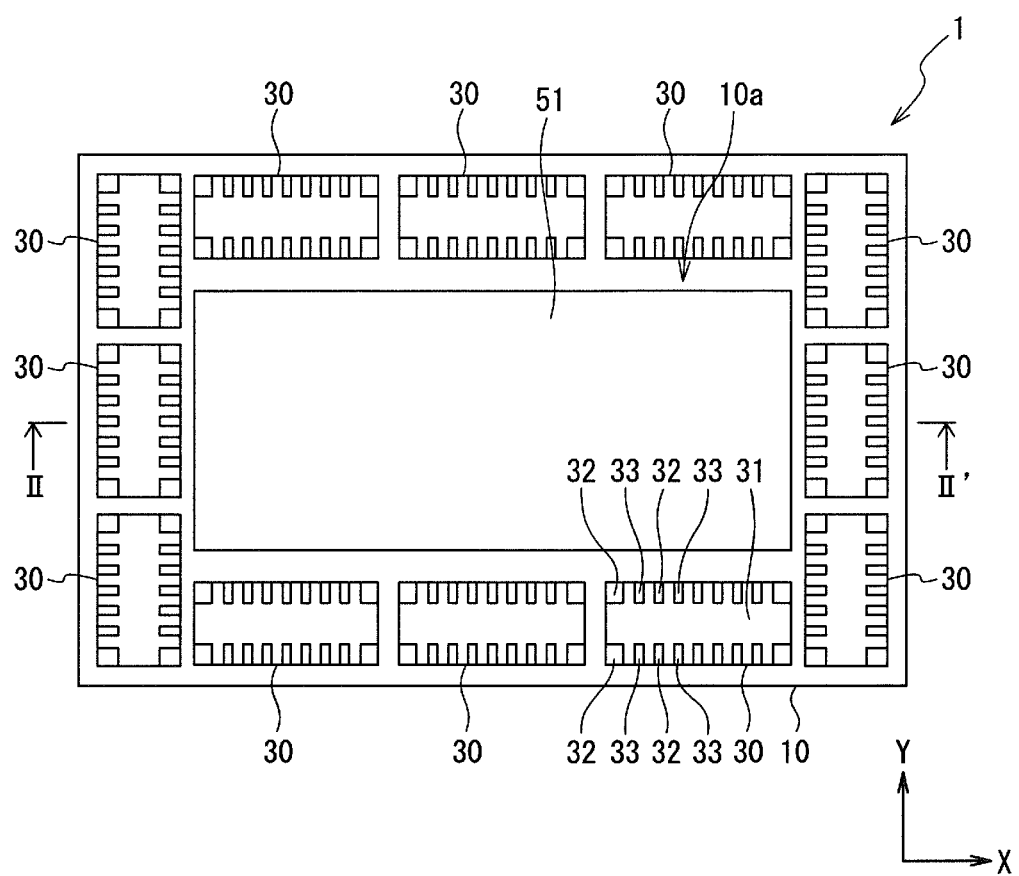
FIG. 1 is a plan view showing a configuration example of an electronic device according to an embodiment of the present disclosure.
Figure 2:
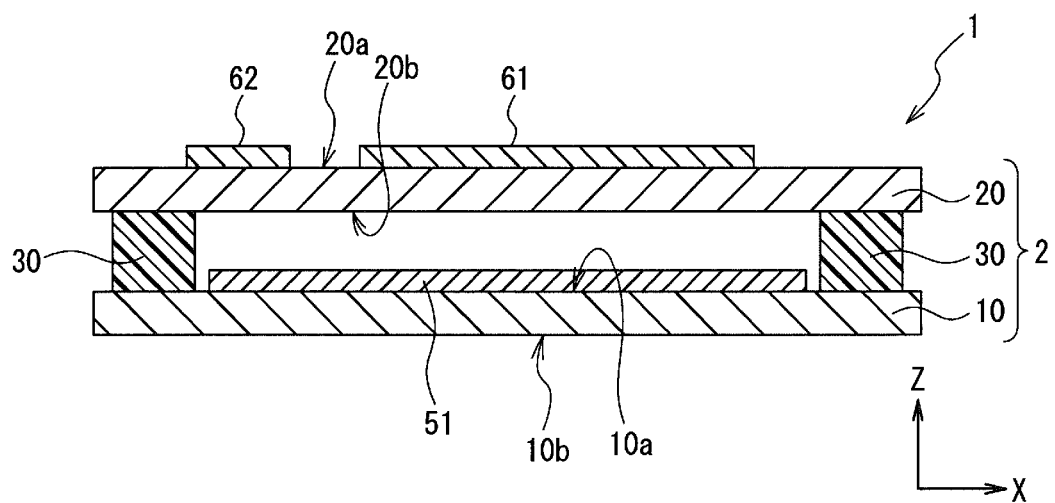
FIG. 2 is a sectional view showing the configuration example of the electronic device according to the embodiment of the present disclosure.

FIG. 1 is a plan view showing a configuration example of an electronic device according to an embodiment of the present disclosure. FIG. 2 is a sectional view showing the configuration example of the electronic device according to the embodiment of the present disclosure. FIG. 2 shows a cross section of FIG. 1 taken along line II-II'. In addition, in order to show a positional relationship between an electronic component 51 and connecting components 30, a second substrate 20 and electronic components 61 and 62 which cover the electronic component 51 have been omitted in FIG. 1.

As shown in FIG. 1, an electronic device 1 includes a substrate having the first substrate 10 (an example of the first substrate portion) and the second substrate 20 (an example of the second substrate portion), a plurality of connecting components 30, and the electronic components 51, 61, and 62. The first substrate 10 and the second substrate 20 face each other. The electronic device 1 can be called a module. The connecting components 30 can be called a substrate-to-substrate connector or a three-dimensional circuit component.

Each of the first substrate 10 and the second substrate 20 is a circuit board. For example, each of the first substrate 10 and the second substrate 20 is a build-up substrate (an example of a rigid substrate). A build-up substrate has an insulated substrate that constitutes a core (hereinafter, a core substrate), a plurality of wiring patterns provided on at least one surface of the core substrate, and a plurality of insulating layers. The wiring patterns and the insulating layers are alternately arranged in a thickness direction of the core substrate. In addition, the insulating layers are provided with a via. A wiring pattern on an upper side of an insulating layer and a wiring pattern on a lower side of the insulating layer are connected through the via. In addition, the wiring patterns and the insulating layers may also be alternately stacked inside the core substrate. In this manner, each of the first substrate 10 and the second substrate 20 has a multilayer wiring structure in which the plurality of wiring patterns are stacked in the thickness direction.

The first substrate 10 has the upper surface 10a and a lower surface 10b positioned on a side opposite to the upper surface 10a. The second substrate 20 has an upper surface 20a and a lower surface 20b positioned on a side opposite to the upper surface 20a. The upper surface 10a of the first substrate 10 and the lower surface 20b of the second substrate 20 face each other in a state where the plurality of connecting components 30 are arranged between the first substrate 10 and the second substrate 20. The upper surface 10a and the lower surface 20b are separated from each other. A length of a distance between the upper surface 10a and the lower surface 20b is equal to a height (in other words, a length in the Z-axis direction) of the connecting components 30.

The upper surface 10a of the first substrate 10 is provided with a land for electrically connecting the upper surface 10a to the electronic component 51 and lands 11 and 12 (refer to FIG. 10) for electrically connecting the upper surface 10a to electrodes 321 and 331 (refer to FIG. 3) that are positioned on a side of a lower surface of the connecting components 30. The lower surface 20b of the second substrate 20 is provided with lands for electrically connecting the lower surface 20b to electrodes 322 and 332 (refer to FIG. 3) that are positioned on a side of an upper surface of the connecting components 30. The upper surface 20a of the second substrate 20 is provided with lands for electrically connecting the upper surface 20a to the electronic components 61 and 62.

The electronic component 51 is surface-mounted to the side of the upper surface 10a of the first substrate 10. The electronic components 61 and 62 are surface-mounted to the side of the upper surface 20a of the second substrate 20. For example, the electronic components 51 and 61 are integrated circuits (ICs). An example of the electronic component 51 is a central processing unit (CPU). An example of the electronic component 61 is an IC for power supply control. In addition, the electronic component 62 is a surface mount device (SMD). Examples of an SMD include a transistor, a diode, a resistor, a capacitor, and an inductor to be surface-mounted. It should be noted that, in the embodiment of the present disclosure, types of the electronic components 51, 61, and 62 are not limited to those described above.

As shown in FIG. 1, the connecting components 30 are arranged in, for example, an outer periphery of the first substrate 10 and the second substrate 20. The number of the connecting components 30 or an arrangement of the connecting components 30 are arbitrarily set in accordance with sizes or circuit structures of the first substrate 10 and the second substrate 20.

Figure 3:
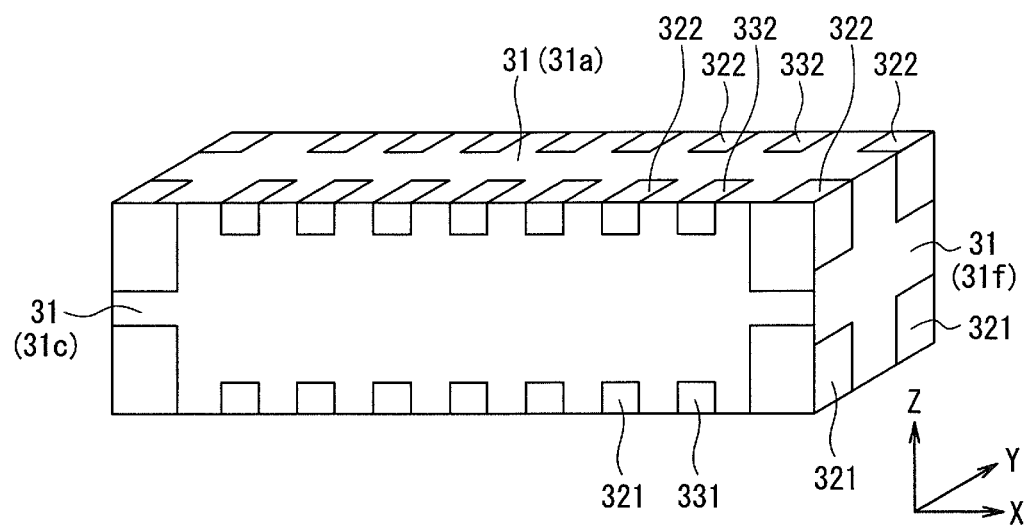
FIG. 3 is a perspective view showing a configuration example of a connecting component according to the embodiment of the present disclosure.
Figure 4A:
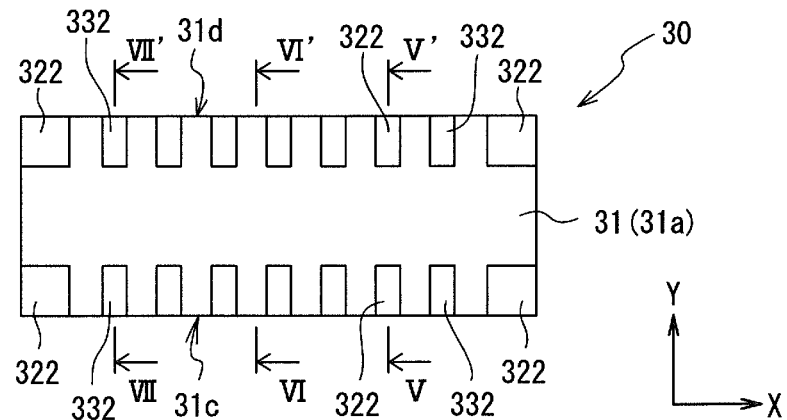
FIG. 4A is a plan view showing the configuration example of the connecting component according to the embodiment of the present disclosure.
Figure 4B:
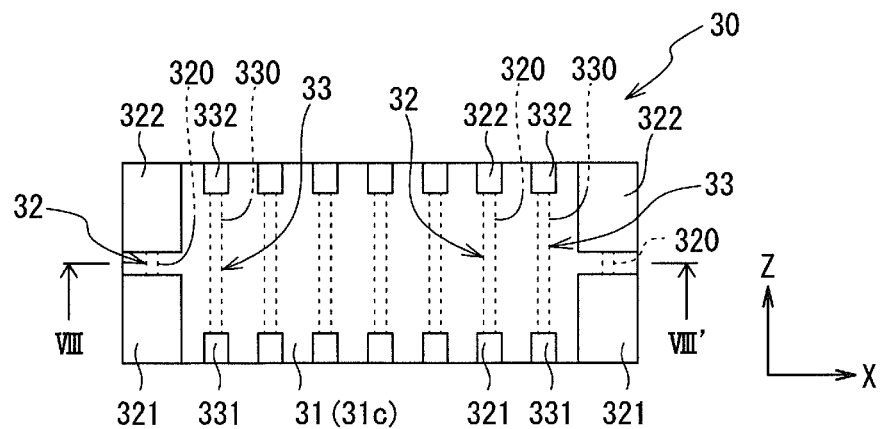
FIG. 4B is a front view showing the configuration example of the connecting component according to the embodiment of the present disclosure.
Figure 4C:
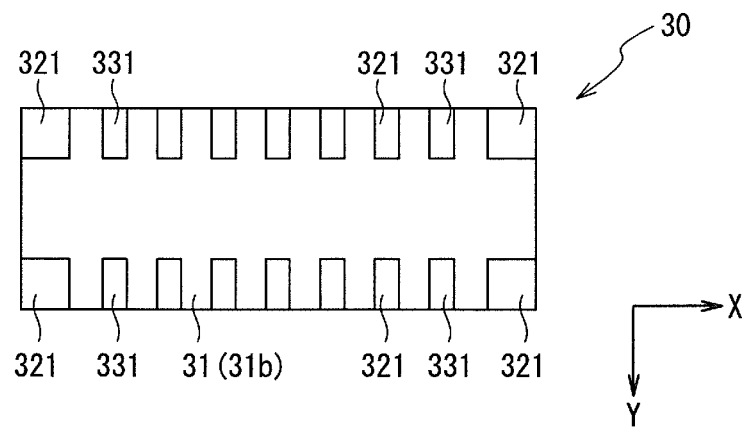
FIG. 4C is a bottom view showing the configuration example of the connecting component according to the embodiment of the present disclosure.
Figure 4D:
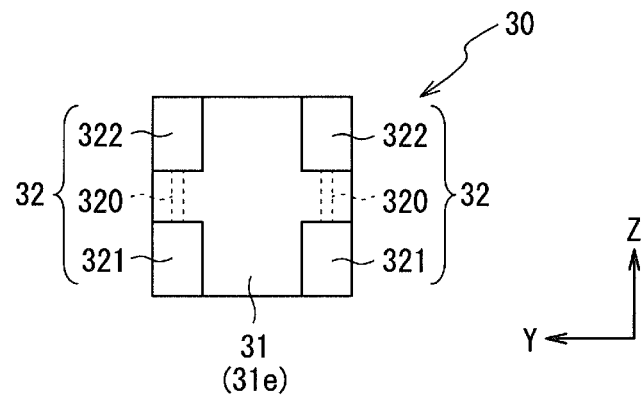
FIG. 4D is a left side view showing the configuration example of the connecting component according to the embodiment of the present disclosure.
Figure 4E:
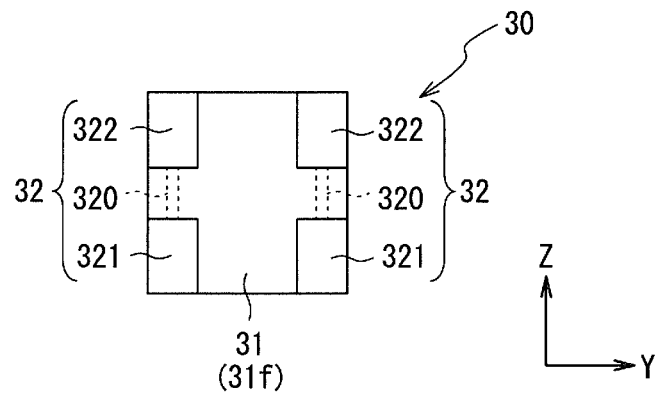
FIG. 4E is a right side view showing the configuration example of the connecting component according to the embodiment of the present disclosure.
Figure 4F:
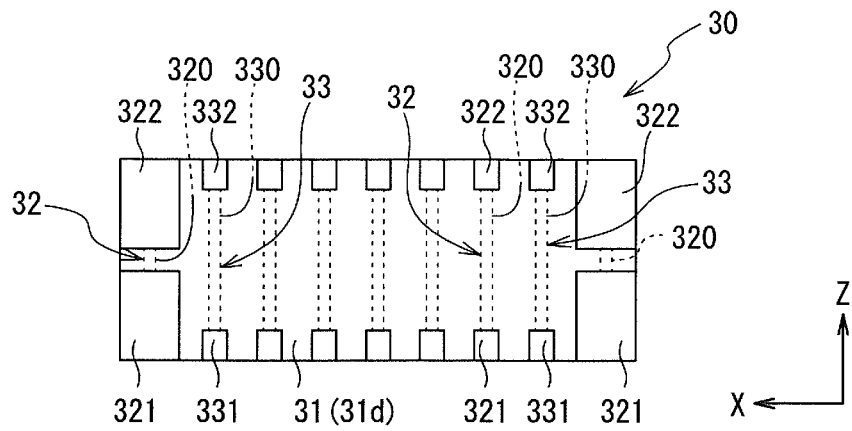
FIG. 4F is a rear view showing the configuration example of the connecting component according to the embodiment of the present disclosure.

FIG. 3 is a perspective view showing a configuration example of a connecting component according to the embodiment of the present disclosure. FIG. 4A is a plan view showing the configuration example of the connecting component according to the embodiment of the present disclosure. FIG. 4B is a front view showing the configuration example of the connecting component according to the embodiment of the present disclosure. FIG. 4C is a bottom view showing the configuration example of the connecting component according to the embodiment of the present disclosure. FIG. 4D is a left side view showing the configuration example of the connecting component according to the embodiment of the present disclosure. FIG. 4E is a right side view showing the configuration example of the connecting component according to the embodiment of the present disclosure. FIG. 4F is a rear view showing the configuration example of the connecting component according to the embodiment of the present disclosure.

Figure 5:
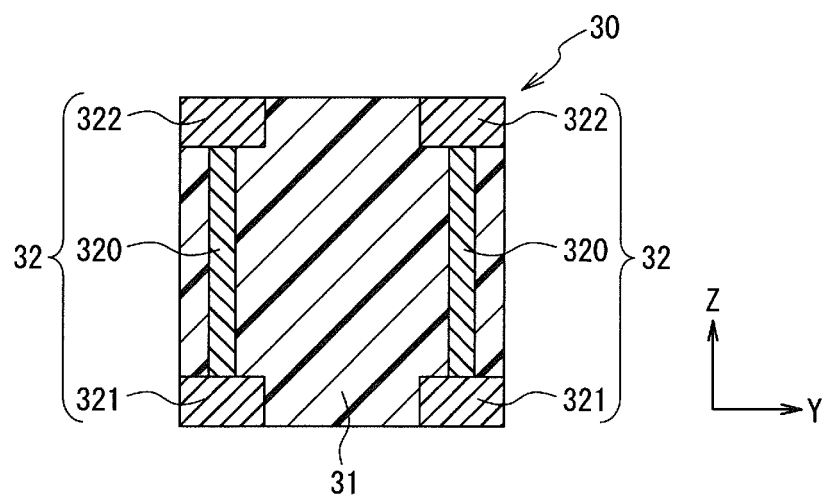
FIG. 5 is a sectional view of the plan view shown in FIG. 4A taken along line V-V.
Figure 6:
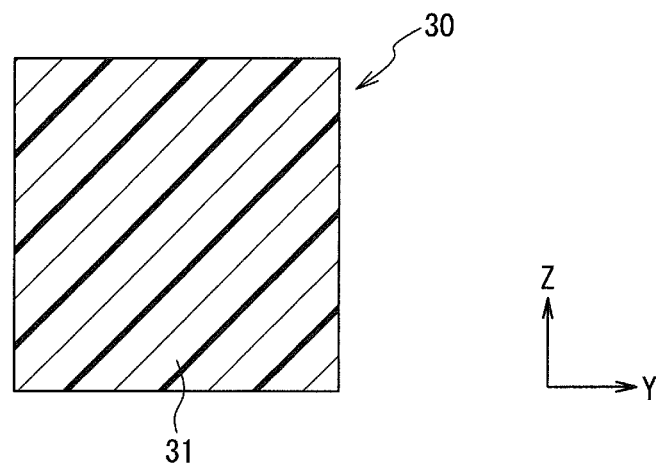
FIG. 6 is a sectional view of the plan view shown in FIG. 4A taken along line VI-VI'.
Figure 7:
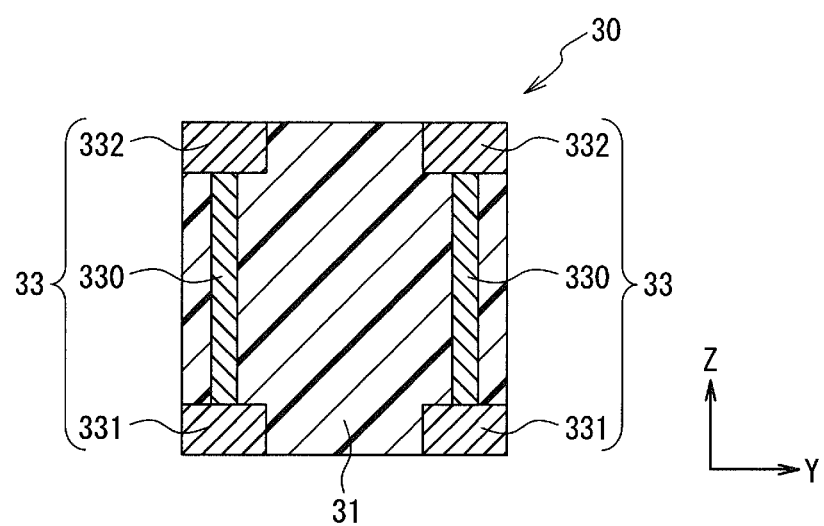
FIG. 7 is a sectional view of the plan view shown in FIG. 4A taken along line VII-VII'.
Figure 8:
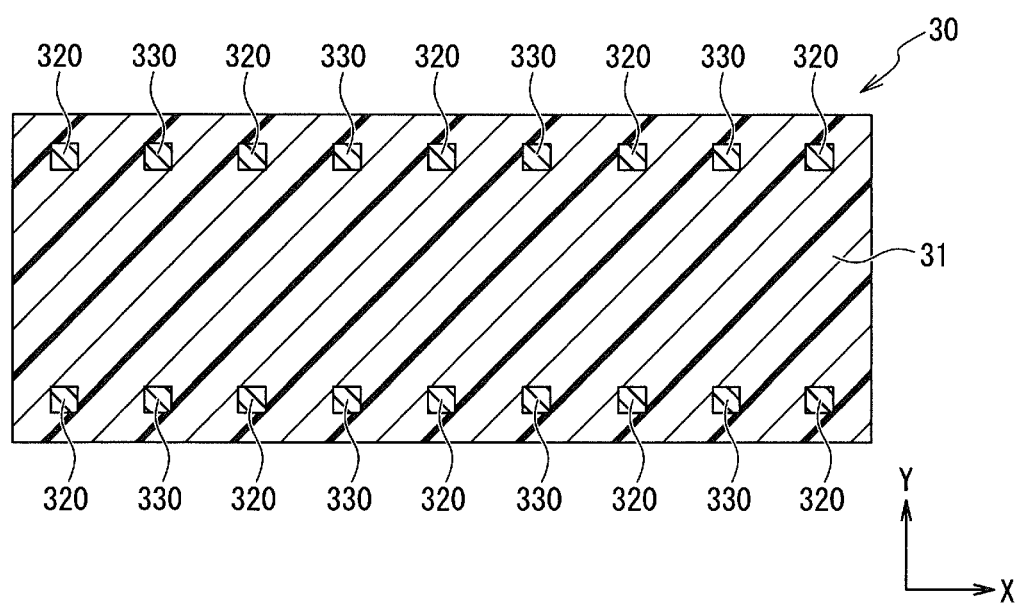
FIG. 8 is a sectional view of the front view shown in FIG. 4B taken along line VIII-VIII'.

FIG. 5 is a sectional view of the plan view shown in FIG. 4A taken along line V-V'. FIG. 5 shows a cross section of a base material 31 and potential wirings 32 taken along a Y-Z plane. FIG. 6 is a sectional view of the plan view shown in FIG. 4A taken along line VI-VI'. FIG. 6 shows a cross section of a portion positioned between a potential wiring 32 and a signal wiring 33 in the base material 31 taken along the Y-Z plane. FIG. 7 is a sectional view of the plan view shown in FIG. 4A taken along line VII-VII'. FIG. 7 shows a cross section of the base material 31 and the signal wirings 33 taken along the Y-Z plane. FIG. 8 is a sectional view of the front view shown in FIG. 4B taken along line VIII-VIII'. FIG. 8 shows a cross section of the base material 31, the potential wirings 32, and the signal wirings 33 taken along an X-Y plane.

As shown in FIGS. 3 to 8, the connecting component 30 according to the embodiment of the present disclosure have the base material 31 with insulation properties, a plurality of potential wirings 32 provided inside the base material 31, and a plurality of signal wirings 33 provided inside the base material 31. The plurality of potential wirings 32 and the plurality of signal wirings 33 are built into the connecting component 30. While the embodiment of the present disclosure does not limit a shape of the connecting component 30, an example of the shape is a rectangular parallelepiped.

The base material 31 has a lower surface 31b to be attached to the first substrate 10 and an upper surface 31a to be attached to the second substrate 20. In the base material 31, the upper surface 31a is positioned on a side opposite to the lower surface 31b. The lower surface 31b and the upper surface 31a are respectively parallel to the X-Y plane.

Each of the plurality of potential wirings 32 has a wiring main body 320 that extends in the Z-axis direction, an electrode 321 positioned at one end of the wiring main body 320, and an electrode 322 positioned at another end of the wiring main body 320. In addition, each of the plurality of signal wirings 33 has a wiring main body 330 that extends in the Z-axis direction, an electrode 331 positioned at one end of the wiring main body 330, and an electrode 332 positioned at another end of the wiring main body 330. The potential wirings 32 and the signal wirings 33 are constituted by a metal such as copper (Cu). A potential of the potential wirings 32 is fixed to, for example, a ground potential (0 V). An electric signal is supplied to the signal wirings 33.

The base material 31 has a front surface 31c and a rear surface 31d which are parallel to the X-Z plane and a left side surface 31e and a right side surface 31f which are parallel to the Y-Z plane. The electrodes 321, 322, 331, and 332 are respectively exposed from the front surface 31c or the rear surface 31d. In addition, among the electrodes 321, 322, 331, and 332, electrodes positioned at corners of the connecting component 30 are exposed not only from the front surface 31c or the rear surface 31d but also from the left side surface 31e or the right side surface 31f. For example, as shown in FIGS. 3 to 4F, the electrodes 321 and 322 are respectively positioned at corners of the connecting component 30. In this case, the electrodes 321 and 322 that are positioned at corners of the connecting component 30 are exposed not only from the front surface 31c or the rear surface 31d but also from the left side surface 31e or the right side surface 31f.

In the connecting component 30, the plurality of potential wirings 32 and the plurality of signal wirings 33 are arranged so as to alternately line up in one direction (for example, the X-axis direction or the Y-axis direction). The potential wirings 32 and the signal wirings 33 are lined up in one direction in, for example, two rows. A first row is positioned on a side of the front surface 31c of the base material 31. A second row is positioned on a side of the rear surface 31d of the base material 31. In each of the first and second rows, the potential wirings 32 are arranged like bars of a cage.

Figure 9:
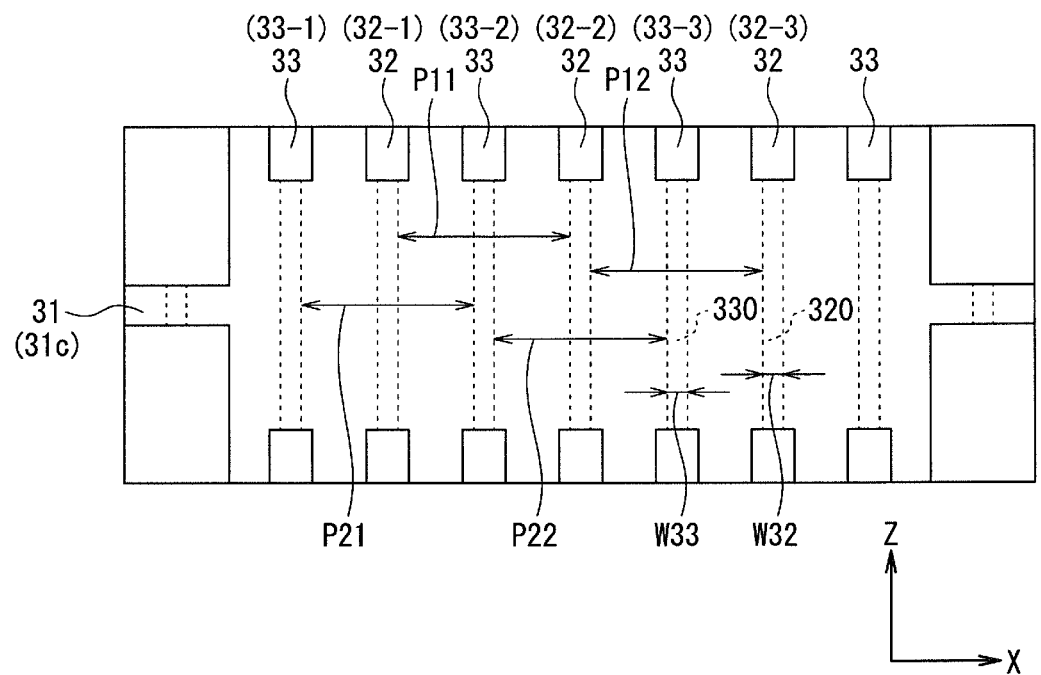
FIG. 9 is a diagram showing an example of line widths and intervals of potential wirings and signal wirings.

FIG. 9 is a diagram showing an example of line widths and intervals of the potential wirings and the signal wirings. As shown in FIG. 9, a line width W32 of the wiring main body 320 of the potential wirings 32 and a line width W33 of the wiring main body 330 of the signal wirings 33 are a same length. The line widths W32 and W33 are 90 μm or more and 110 μm or less.

In addition, among the plurality of potential wirings 32, intervals of at least a component of the potential wirings 32 are constant. For example, the potential wirings 32 include a first potential wiring 32-1, a second potential wiring 32-2, and a third potential wiring 32-3 which are adjacent to each other in the X-axis direction. A distance P11 between the first potential wiring 32-1 and the second potential wiring 32-2 and a distance P12 between the second potential wiring 32-2 and the third potential wiring 32-3 are a same length. The distances P11 and P12 are 490 μm or more and 510 μm or less. In a similar manner, intervals of the signal wirings 33 that line up in one direction are constant. For example, the signal wirings 33 include a first signal wiring 33-1, a second signal wiring 33-2, and a third signal wiring 33-3 which are adjacent to each other in the X-axis direction. A distance P21 between the first signal wiring 33-1 and the second signal wiring 33-2 and a distance P22 between the second signal wiring 33-2 and the third signal wiring 33-3 are a same length. The distances P21 and P22 are 490 μm or more and 510 μm or less.

Figure 10:
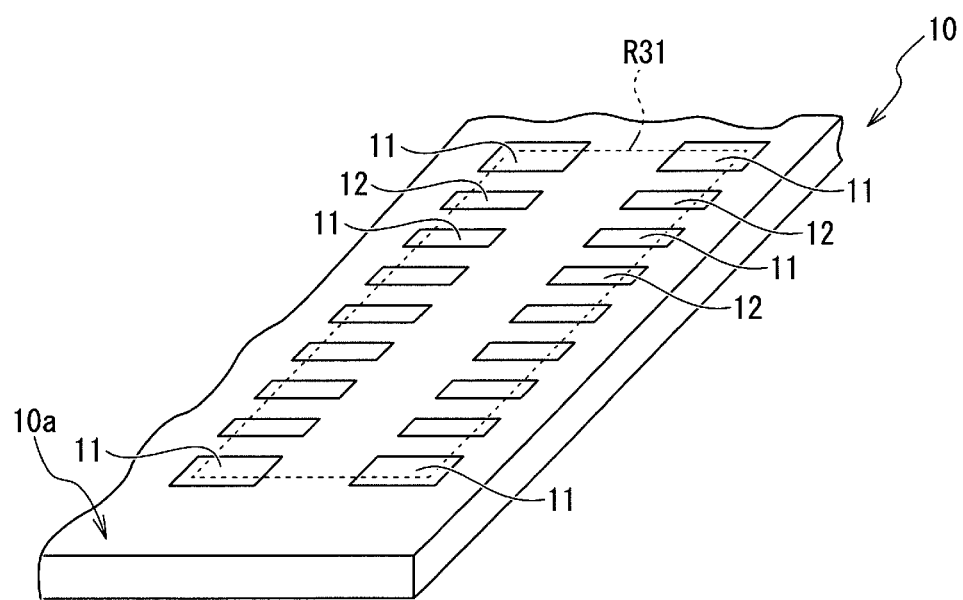
FIG. 10 is a perspective view showing a configuration example of a first substrate.

FIG. 10 is a perspective view showing a configuration example of the first substrate. As shown in FIG. 10, an attachment region R31 for attaching the connecting component 30 is set in advance on the upper surface 10a of the first substrate 10. The lands 11 and 12 are provided in the attachment region R31. The land 11 is an electrode to be bonded to the electrode 321 included in the connecting component 30. The land 11 is provided at a position that faces the electrode 321 of the connecting component 30 to be arranged in the attachment region R31. The land 12 is an electrode to be bonded to the electrode 331 included in the connecting component 30. The land 12 is provided at a position that faces the electrode 331 of the connecting component 30 to be arranged in the attachment region R31.

Figure 11:
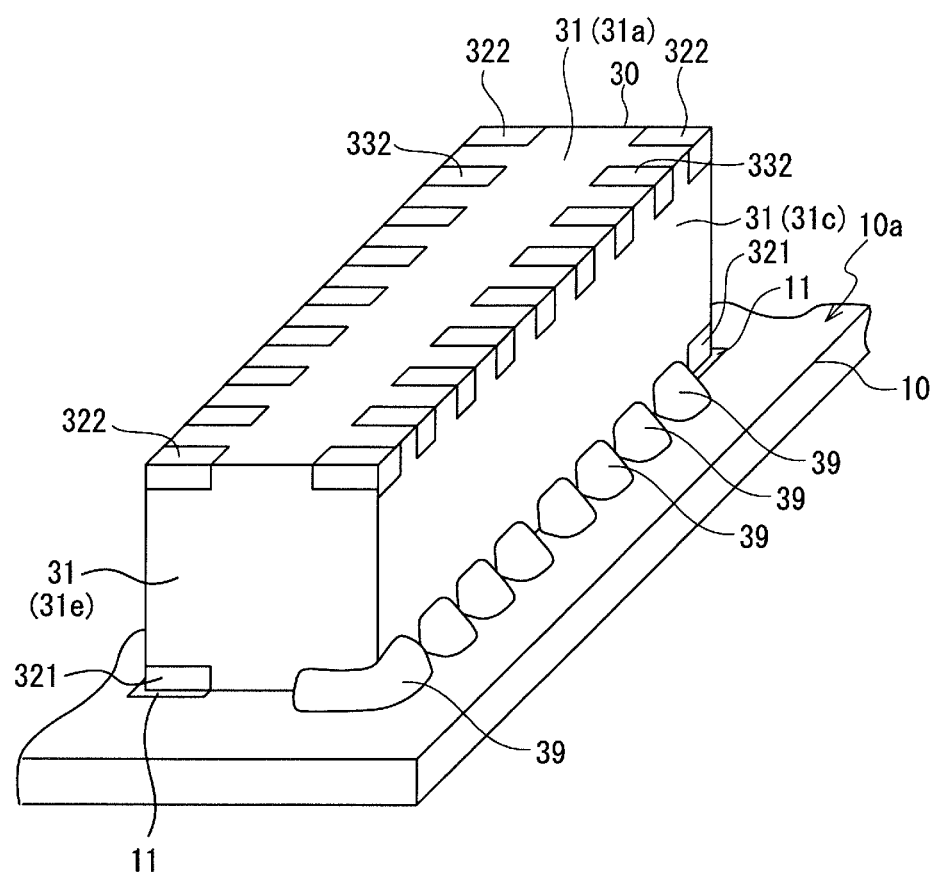
FIG. 11 is a perspective view showing a state where the connecting component has been attached to the first substrate.

FIG. 11 is a perspective view showing a state where the connecting component has been attached to the first substrate. As shown in FIG. 11, the first substrate 10 and the connecting component 30 are bonded via a solder 39. The land 11 of the first substrate 10 is connected to the electrode 321 of the connecting component 30 via the solder 39. The land 12 of the first substrate 10 is connected to the electrode 331 of the connecting component 30 via the solder 39.

In addition, the electrodes 321 and 331 are exposed from the lower surface 31b of the base material 31 and, at the same time, also exposed from the front surface 31c, the rear surface 31d, the left side surface 31e, or the right side surface 31f (hereinafter, these surfaces will also be referred to as outer circumferential surfaces) of the base material 31. Furthermore, a portion that is exposed from the outer circumferential surface of the base material 31 among the electrode 321 is also connected to the land 11 via the solder 39. In a similar manner, a portion that is exposed from the outer circumferential surface of the base material 31 among the electrode 331 is also connected to the land 12 via the solder 39. Accordingly, compared to a case where the electrodes 321 and 331 are only exposed from the lower surface 31b of the base material 31, since a contact area between the electrodes 321 and 331 and the solder 39 can be increased, a bonding strength between the first substrate 10 and the connecting component 30 can be increased. It should be noted that a mode of bonding between the second substrate 20 and the connecting component 30 is similar to the mode of bonding between the first substrate 10 and the connecting component 30 shown in FIG. 11.

Figure 12:
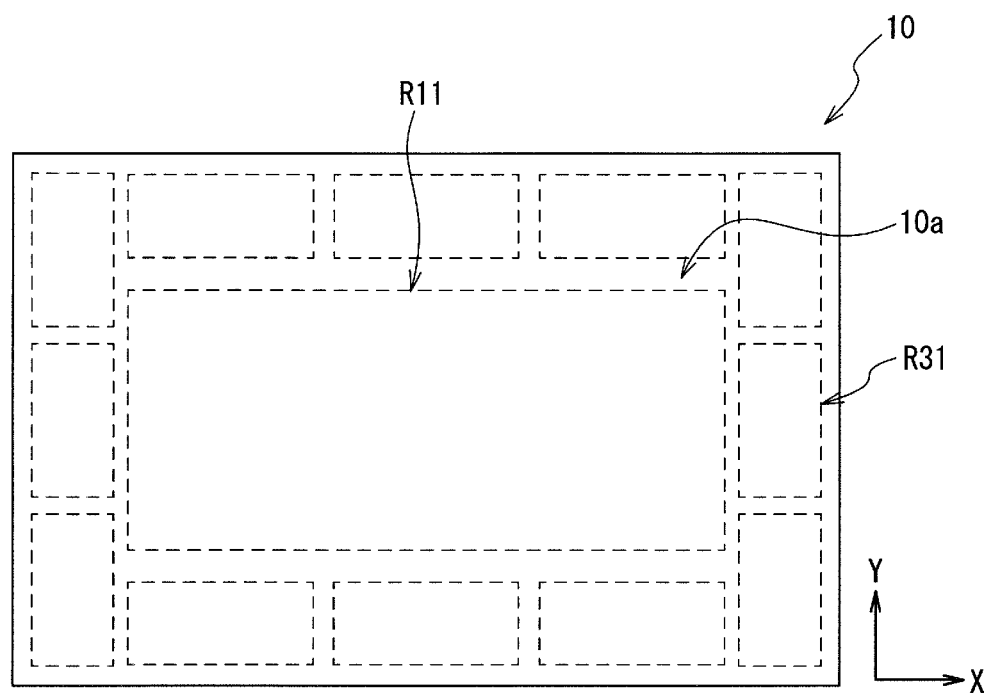
FIG. 12 is a diagram showing a mounting region of an electronic component and attachment regions of the connecting components in the first substrate.
Figure 13:
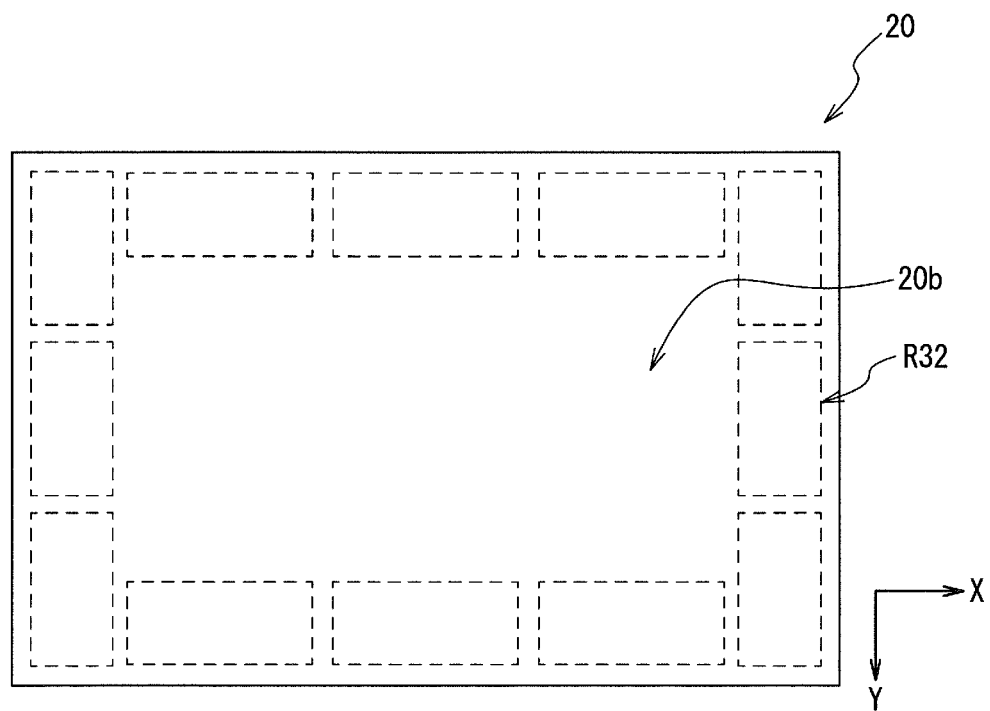
FIG. 13 is a diagram showing attachment regions of the connecting components in a second substrate.

FIG. 12 is a diagram showing a mounting region of an electronic component and attachment regions of the connecting components in the first substrate. FIG. 13 is a diagram showing attachment regions of the connecting components in the second substrate. As shown in FIG. 12, the first substrate 10 has a mounting region R11 to which the electronic component 51 is to be mounted on a side of the upper surface 10a and the attachment regions R31 to which the side of a lower surface 30b (refer to FIG. 4C) of the connecting components 30 is to be attached. The plurality of attachment regions R31 are arranged so as to surround the mounting region R11 in a plan view. In addition, as shown in FIG. 13, the second substrate 20 has attachment regions R32 to which the side of an upper surface 30a (refer to FIG. 4A) of the connecting components 30 is to be attached on the side of the lower surface 20b. The attachment regions R32 of the second substrate 20 are provided at positions facing the attachment regions R31 of the first substrate 10.

Figure 14:
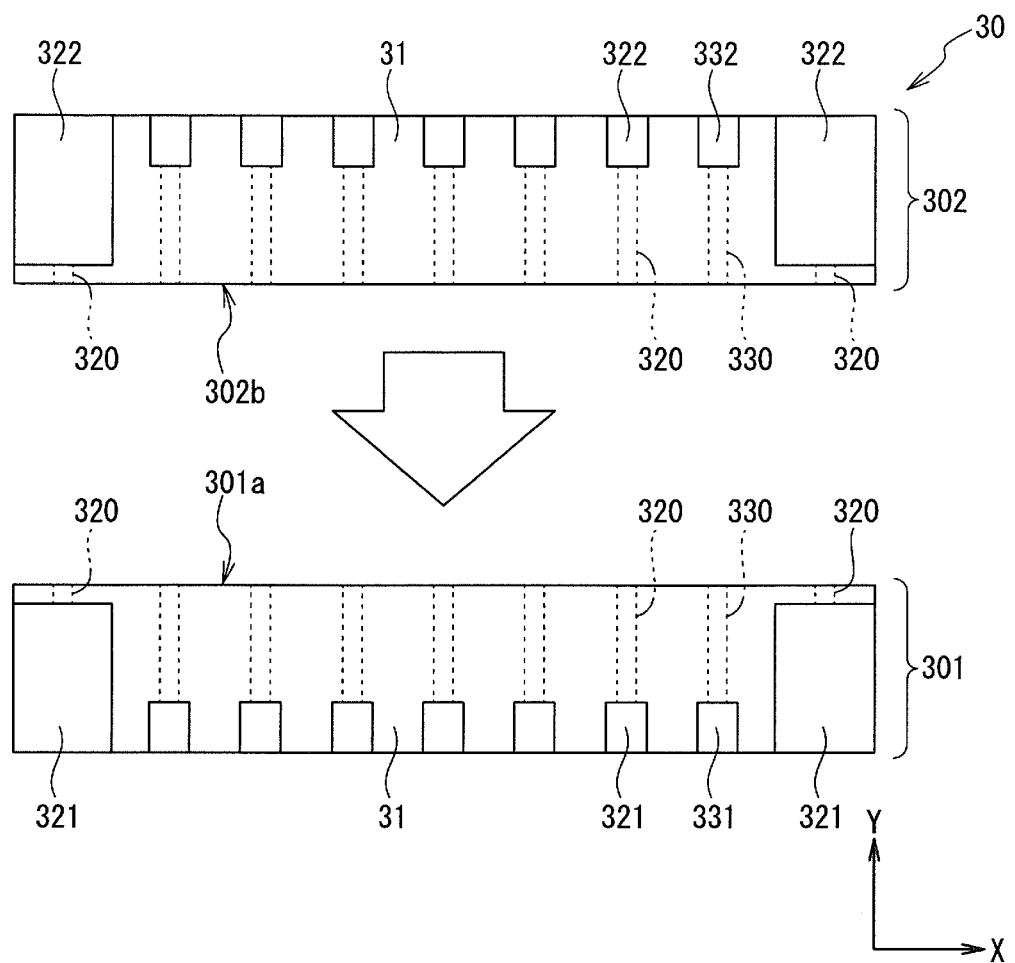
FIG. 14 is a diagram showing an example of the connecting component.

FIG. 14 is a diagram showing an example of the connecting component. The connecting component 30 may be constructed by combining a plurality of components. For example, as shown in FIG. 14, the connecting component 30 may be constituted by a lower component 301 and an upper component 302. The lower component 301 has the electrodes 321 and 331, a lower portion of the wiring main body 320, and a lower portion of the base material 31. The upper component 302 has the electrodes 322 and 332, an upper portion of the wiring main body 320, and an upper portion of the base material 31. The connecting component 30 is manufactured by bonding a lower surface 302b of the upper component 302 to an upper surface 301a of the lower component 301.

In addition, in the embodiment of the present disclosure, the connecting component 30 may be constituted by three or more components instead of two components. For example, at least one of the lower component 301 and the upper component 302 may be constructed by stacking a plurality of sheet-like substrates. An example of a sheet-like substrate is a ceramic green sheet on which a circuit pattern is printed. The connecting component 30 may be manufactured by forming a stacked body by stacking a plurality of green sheets on which a circuit pattern is printed and baking the formed stacked body.

Figure 15:
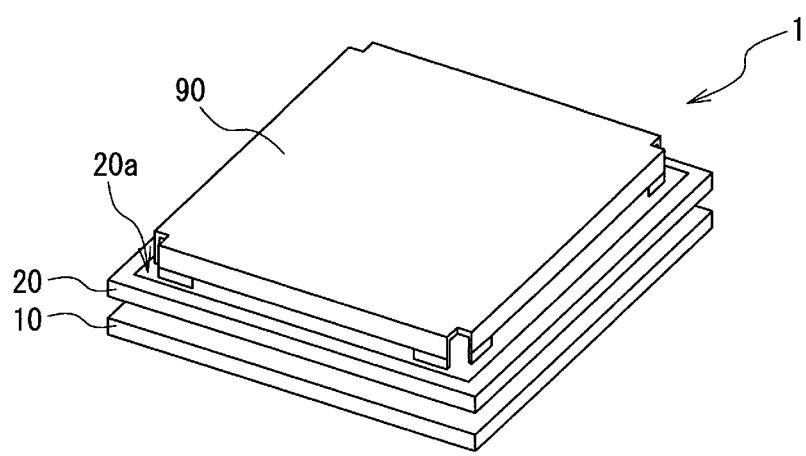
FIG. 15 is a perspective view showing an example of the electronic device according to the embodiment of the present disclosure.
Figure 16:
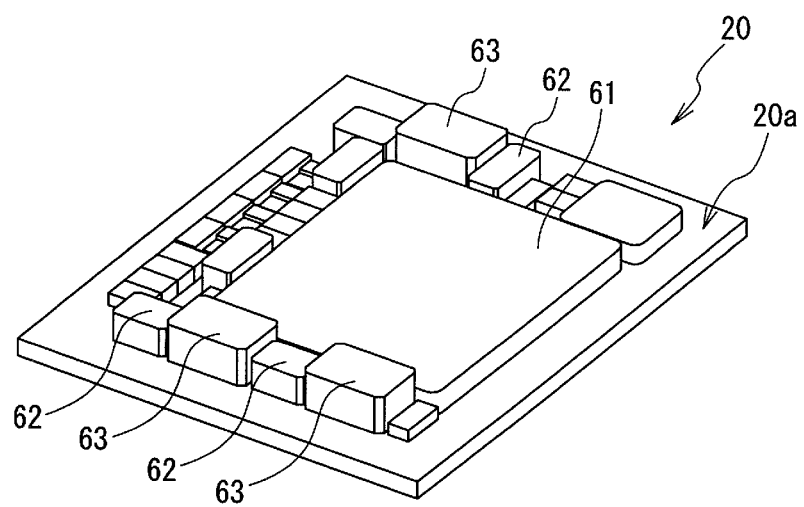
FIG. 16 is a perspective view showing an example of the second substrate and an electronic component to be mounted to the second substrate.
Figure 17:
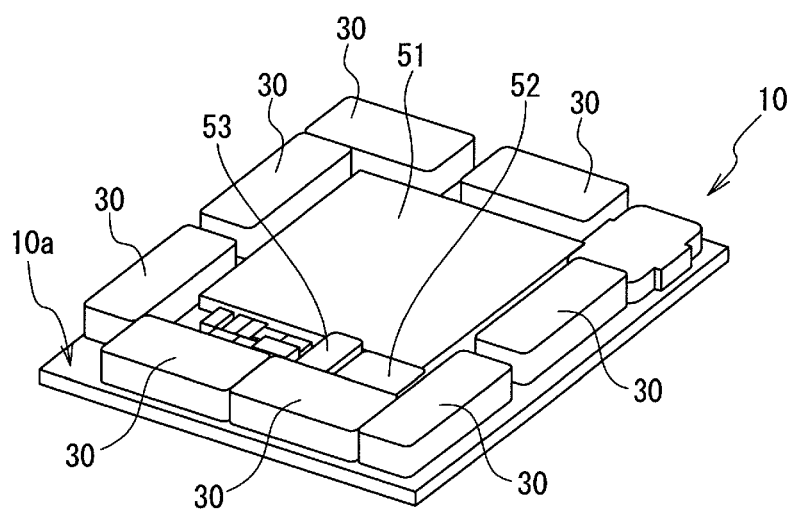
FIG. 17 is a perspective view showing an example of the first substrate, an electronic component to be mounted to the first substrate, and the connecting components.

FIG. 15 is a perspective view showing an example of the electronic device according to the embodiment of the present disclosure. FIG. 16 is a perspective view showing an example of the second substrate and an electronic component to be mounted to the second substrate. FIG. 17 is a perspective view showing an example of the first substrate, an electronic component to be mounted to the first substrate, and the connecting components.

As shown in FIG. 15, the electronic device 1 may include a cover 90 that is arranged on a side of the upper surface 20a of the second substrate 20. The cover 90 is an electromagnetic shield created by, for example, bending a metal plate. The cover 90 is surface-mounted to the upper surface 20a of the second substrate 20 by a solder using a surface-mounting technique. Alternatively, the cover 90 may be fixed to the second substrate 20 by, for example, a fastener such as a bolt and a nut. In addition, as shown in FIG. 16, the electronic device 1 may include an electronic component 63 that is mounted to a side of the upper surface 20a of the second substrate 20. The electronic component 63 may be a component having a same function as the electronic components 61 and 62 or a component having a different function from the electronic components 61 and 62. For example, the electronic component 63 is an IC or an SMD. The cover 90 is mounted in order to suppress electromagnetic noise that is emitted from a part of the electronic component 61. In addition, the cover 90 may have a function of covering and protecting the electronic components 61 to 63 that are mounted to the upper surface 20a of the second substrate 20.

As shown in FIG. 17, the electronic device 1 may include electronic components 52 and 53 which are mounted to a side of the upper surface 10a of the first substrate 10. The electronic components 52 and 53 may be components having a same function as the electronic component 51 or components having a different function from the electronic component 51. For example, the electronic components 52 and 53 are ICs or SMDs. The electronic components 51 to 53 are mounted in, for example, the mounting region R11 on the side of the upper surface 10a of the first substrate 10. The plurality of connecting components 30 are arranged so as to surround the electronic components 51 to 53.

As described above, the electronic device 1 according to the embodiment of the present disclosure includes: the first substrate 10; the second substrate 20 that is arranged at a position facing the first substrate 10; a plurality of potential wirings 32 which are connected to the first substrate 10 and to the second substrate 20 and which have an arbitrary potential; and a plurality of signal wirings 33 which are connected to the first substrate 10 and to the second substrate 20 and to which a signal is supplied. The first substrate 10 has a mounting region R11 of an electronic component on a side of a surface (for example, the upper surface 10a) facing the second substrate 20. The plurality of potential wirings 32 may be arranged outside of the mounting region R11. Accordingly, a circuit board 2 with a stack structure in which the first substrate 10 and the second substrate 20 are connected to each other by the connecting components 30 is constructed. The circuit board 2 with a stack structure may be referred to as a three-dimensional circuit pattern.

In addition, the plurality of potential wirings 32 function as a shield that shields electromagnetic waves. The plurality of potential wirings 32 prevent electromagnetic waves from penetrating to the mounting region R11 from outside of the electronic device 1 (hereinafter, the outside) and prevent electromagnetic waves from leaking to the outside from the mounting region R11. Shield members (the plurality of potential wirings 32) are arranged in a region for establishing continuity (an electrical connection) between the first substrate 10 and the second substrate 20. Accordingly, the potential wirings 32 that function as a shield and the signal wirings 33 can be arranged at a narrow pitch of, for example, 0.3 mm and respective arrangements of the shields and the signal wirings 33 can be arbitrarily designed. For this reason, a multi-applicable electromagnetic shield not realizable with a conventional metal-plate shield case can now be realized and can make a significant contribution toward downsizing.

In other words, a boundary of an electromagnetic field can be realized at low cost by simply bending sheet metal into a box shape as a shield case and surface-mounting the shield case to a substrate. However, since there is a possibility that cost may increase significantly when there are many bent portions and machined portions and, given that there are also physical machining limits, it is difficult to realize a complex and high-definition shield structure. When using a shield case, in consideration of an increase in cost and physical machining limits, a relatively large clearance (space) must be provided between mounted components and the shield which makes downsizing difficult. By comparison, since the electronic device 1 according to an aspect of the present disclosure enables respective arrangements of the shields and the signal wirings 33 to be arbitrarily designed at a narrow pitch of, for example, 0.3 mm, downsizing can be achieved.

A shield case is used to suppress noise and unwanted radiation with respect to an electronic component and is fixed to the substrate using a lid or by soldering. When using a shield case, a region for fixing the shield case must be prepared on the substrate and may require an area that is larger than the electronic component. Accordingly, there is a possibility that substrate size may increase. By comparison, since the electronic device 1 according to the embodiment of the present disclosure does not use a shield case between the first substrate 10 and the second substrate 20, an increase in substrate size can be suppressed.

In addition, while PTL 1 described earlier provides means to form a shield function when a circuit board is being manufactured without the use of a shield case, this requires specialized equipment and complex processes in the manufacturing stage. Therefore, a circuit module may end up being expensive. By comparison, the electronic device 1 according to the embodiment of the present disclosure does not require specialized equipment and complex processes. For example, the connecting component 30 is manufactured by forming a stacked body by stacking a plurality of green sheets on which a circuit pattern is printed and baking the formed stacked body. This manufacturing method does not require specialized equipment and complex processes.

The connecting component 30 can be manufactured using general equipment (for example, an apparatus that stacks green sheets and an apparatus that bakes a stacked body). In addition, connection of the connecting component 30 with respect to the first substrate 10 and the second substrate 20 can be realized by general mounting by soldering using reflow. In this manner, the connecting component 30 and the electronic device 1 including the connecting component 30 can be respectively manufactured without using special equipment. Therefore, there is a possibility that the connecting component 30 and the electronic device 1 including the connecting component 30 can be respectively manufactured inexpensively.

In addition, the electronic device 1 further includes the electronic component 51 to be mounted to the mounting region R11. Accordingly, the plurality of potential wirings 32 can prevent electromagnetic waves from penetrating to the electronic component 51 from the outside. The electronic component 51 can be prevented from malfunctioning due to penetrating electromagnetic waves (noise). In addition, the plurality of potential wirings 32 can also prevent electromagnetic waves from leaking to the outside from the electronic component 51. Accordingly, other electronic components that are built into the electronic device 1 and other electronic devices that are positioned around the electronic device 1 can be prevented from malfunctioning due to electromagnetic waves emitted by the electronic component 51.

Furthermore, the plurality of potential wirings 32 are arranged so as to surround the mounting region R11. For example, the plurality of potential wirings 32 are arranged so as to surround the electronic component 51 that is mounted in the mounting region R11. Accordingly, the plurality of potential wirings 32 can shield electromagnetic waves around the electronic component 51. The plurality of potential wirings 32 can prevent electromagnetic waves from penetrating to the electronic component 51 from a periphery of the electronic component 51 and prevent electromagnetic waves from leaking to the periphery from inside the electronic component 51. The plurality of potential wirings 32 can shield the electronic component 51 from the periphery and further enhance the shield function.

It should be noted that the plurality of connecting components 30 are favorably arranged in a state where the connecting components 30 are in sufficient close contact with each other or sufficiently close to each other to form a boundary of an electromagnetic field. Accordingly, a gap that enables noise or unwanted radiation to pass through can be prevented from being created and the shield function can be enhanced.

In addition, the plurality of potential wirings 32 are arranged so as to be adjacent to the mounting region R11. For example, the plurality of potential wirings 32 are arranged so as to be adjacent to the electronic component 51 that is mounted in the mounting region R11. Accordingly, the plurality of potential wirings 32 can construct a space that is densely packed with boundaries of an electromagnetic field. As a result, the plurality of potential wirings 32 can construct an electromagnetic shield in a space that is smaller than a conventional metal plate shield.

Furthermore, the electronic device 1 further includes the plurality of connecting components 30 to be arranged between the first substrate 10 and the second substrate 20. The connecting components 30 have 31 base materials with insulation properties. The plurality of potential wirings 32 and the plurality of signal wirings 33 are arranged inside the base material 31. In other words, the connecting components 30 incorporate the plurality of potential wirings 32 and the plurality of signal wirings 33. Accordingly, the connecting components 30 can have a shield function. In addition, since the plurality of potential wirings 32 and the plurality of signal wirings 33 are arranged inside the base material 31, compared to a case where the plurality of potential wirings 32 and the plurality of signal wirings 33 are arranged outside the base material 31, the possibility of the plurality of potential wirings 32 and the plurality of signal wirings 33 inadvertently coming into contact with an external member and becoming conductive or scratched or being exposed to outside atmosphere and becoming corroded can be reduced. It should be noted that, in the present embodiment, the plurality of potential wirings 32 and the plurality of signal wirings 33 may be provided outside the base material 31.

In addition, attaching a single connecting component 30 on the side of the upper surface 10a of the first substrate 10 enables one of the ends (for example, the plurality of electrodes 321) of the plurality of potential wirings 32 and one of the ends (for example, the plurality of electrodes 331) of the plurality of signal wirings 33 to be connected to the first substrate 10 at once. Attaching a single connecting component 30 on the side of the lower surface 20b of the second substrate 20 enables the other end (for example, the plurality of electrodes 322) of the plurality of potential wirings 32 and the other end (for example, the plurality of electrodes 332) of the plurality of signal wirings 33 to be connected to the second substrate 20 at once. In this manner, since attaching a single connecting component 30 to a substrate enables a plurality of electrodes to be connected to the substrate at once, the electronic device 1 can be manufactured in a facilitated manner.

Furthermore, the plurality of potential wirings 32 include the first potential wiring 32-1, the second potential wiring 32-2, and the third potential wiring 32-3. The first potential wiring 32-1, the second potential wiring 32-2, and the third potential wiring 32-3 are arranged so as to line up in a direction (for example, the X-axis direction or the Y-axis direction) that is perpendicular to a direction (for example, the Z-axis direction) in which the first substrate 10 and the second substrate 20 face each other. The distance P11 between the first potential wiring 32-1 and the second potential wiring 32-2 and the distance P12 between the second potential wiring 32-2 and the third potential wiring 32-3 may be the same. The narrower the intervals between the plurality of potential wirings 32, the higher the frequency of electromagnetic waves that can be shielded by the potential wirings 32.

Frequency characteristics at which a shield effect is produced can be adjusted by adjusting the arrangement of the potential wirings 32.

The connecting component 30 according to the embodiment of the present disclosure are arranged between the first substrate 10 and the second substrate 20 which face each other. The connecting component 30 includes: the base material 31 having a first surface (for example, the lower surface 31b) and a second surface (for example, the upper surface 31a) that is arranged on a side opposite to the lower surface 31b; the plurality of potential wirings 32 which are provided inside the base material 31 and which have an arbitrary potential; and the plurality of signal wirings 33 which are provided inside the base material 31 and to which a signal is supplied. One end (for example, the electrode 321) of the potential wirings 32 and one end (for example, the electrode 331) of the signal wirings 33 are respectively exposed from the lower surface 31*b*. Another end (for example, the electrode 322) of the potential wirings 32 and another end (for example, the electrode 332) of the signal wirings 33 are respectively exposed from the upper surface 31*a*.

Accordingly, the electrodes 321 of the potential wirings 32 and the electrodes 331 of the signal wirings 33 can be connected to the first substrate 10. The electrodes 322 of the potential wirings 32 and the electrodes 332 of the signal wirings 33 can be connected to the second substrate 20. The connecting component 30 can connect the first substrate 10 and the second substrate 20 to each other and construct the circuit board 2 with a stack structure. In addition, the plurality of potential wirings 32 function as a shield that shields electromagnetic waves. Shield members (the plurality of potential wirings 32) are arranged in a region for establishing continuity (an electrical connection) between the first substrate 10 and the second substrate 20. Accordingly, the connecting component 30 enables downsizing of the electronic device 1 having a shield function.

First Modification

In the embodiment of the present disclosure, a conductive layer to be connected to the potential wirings may be provided on at least one of the first substrate 10 and the second substrate 20.

Figure 18:
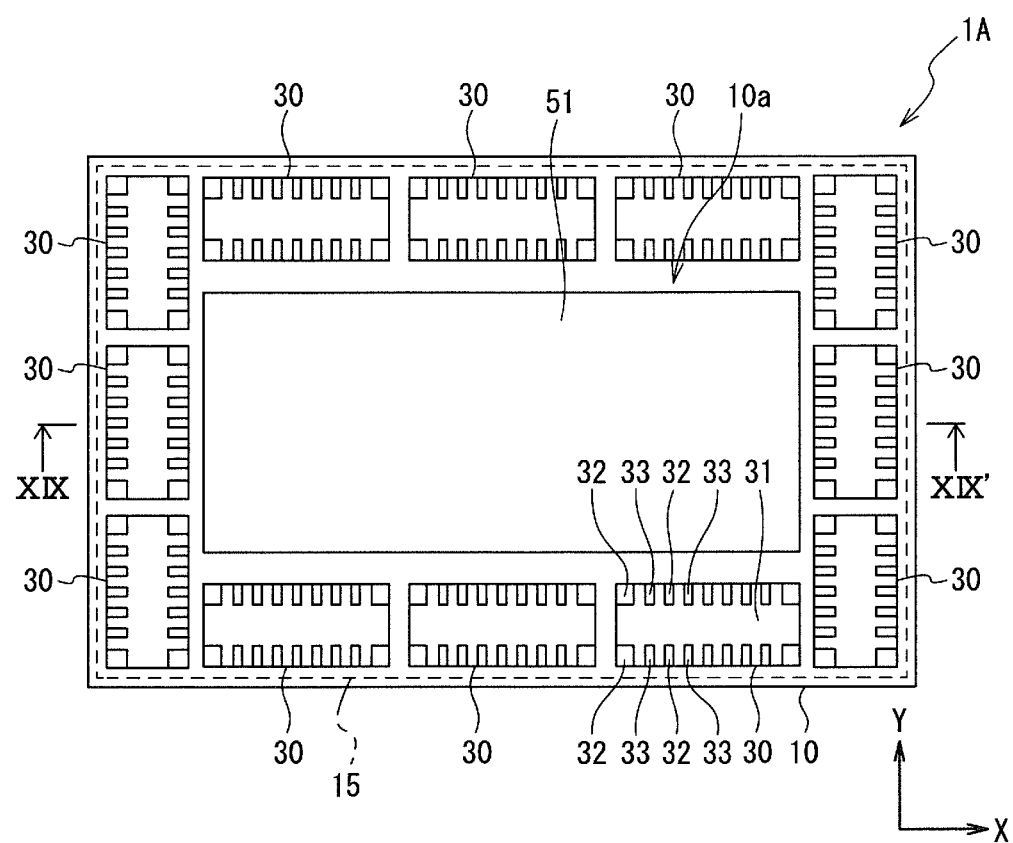
FIG. 18 is a plan view showing a configuration of an electronic device according to a first modification of the embodiment of the present disclosure.
Figure 19:
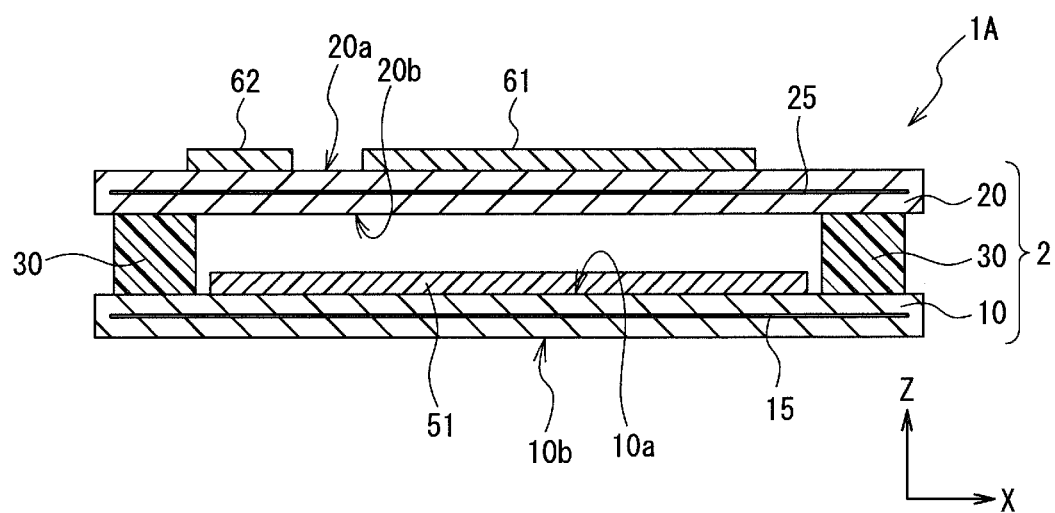
FIG. 19 is a sectional view showing a configuration of an electronic device according to the first modification of the embodiment of the present disclosure.

FIG. 18 is a plan view showing a configuration of an electronic device according to a first modification of the embodiment of the present disclosure. FIG. 19 is a sectional view showing a configuration of an electronic device according to the first modification of the embodiment of the present disclosure. FIG. 19 shows a cross section of FIG. 18 taken along line XIX-XIX'. In addition, in order to show a positional relationship between the electronic component 51 and the connecting component 30, the second substrate 20 and electronic components 61 and 62 which cover the electronic component 51 have been omitted in FIG. 18.

As shown in FIGS. 18 and 19, an electronic device 1A according to the first modification of the embodiment of the present disclosure includes a first conductive layer 15 provided on the first substrate 10 and a second conductive layer 25 provided on the second substrate 20. For example, the first conductive layer 15 and the second conductive layer 25 are respectively constituted by a metal such as Cu. The first conductive layer 15 and the second conductive layer 25 are arranged at positions that overlap with the mounting region R11 (in other words, positions that overlap with the electronic component 51) in a plan view. The first conductive layer 15 may be provided inside the first substrate 10 or provided on the side of the lower surface 10*b* of the first substrate 10. In addition, the second conductive layer 25 may also be provided inside the second substrate 20 or provided on the side of the lower surface 20*b* of the second substrate 20. The first conductive layer 15 and the second conductive layer 25 are connected to the potential wirings 32. Accordingly, the electronic component 51 is surrounded by the plurality of potential wirings 32, the first conductive layer 15, and the second conductive layer 25. FIGS. 18 and 19 show a mode in which the first conductive layer 15 is provided inside the first substrate 10 and the second conductive layer 25 is provided inside the second substrate 20.

With the electronic device 1A according to the first modification of the embodiment, the first conductive layer 15 and the second conductive layer 25 can prevents penetration of electromagnetic waves into the electronic component 51 from the outside and leakage of electromagnetic waves to the outside from the electronic component 51 in a direction that intersects with the upper surface 10*a* of the first substrate 10 (for example, the X-Y plane). In addition to the connecting components 30, the first conductive layer 15 and the second conductive layer 25 also function as a shield that shields electromagnetic waves. Accordingly, the electronic device 1A is capable of further enhancing the shield function.

Second Modification

In the embodiment of the present disclosure, a conductive layer to be connected to the potential wirings 32 may be built into the connecting components 30.

Figure 20A:
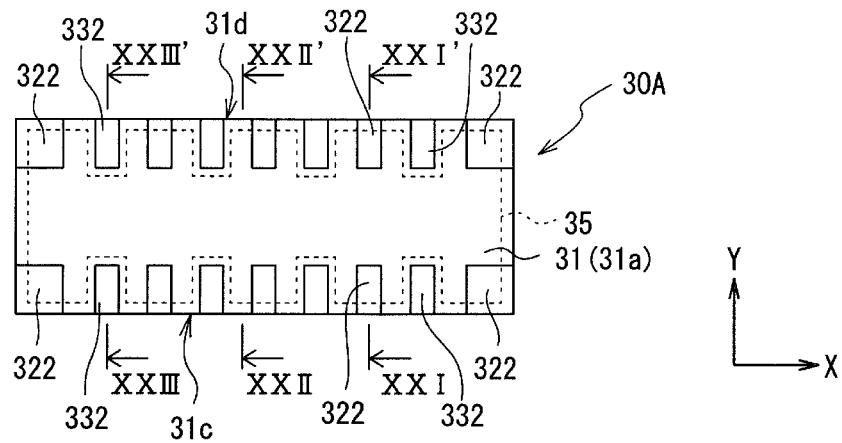
FIG. 20A is a plan view showing a configuration of a connecting component according to a second modification of the embodiment of the present disclosure.
Figure 20B:
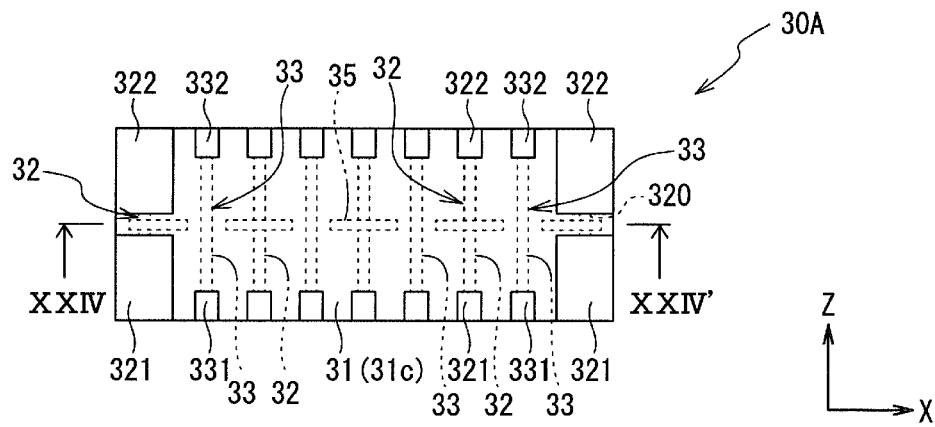
FIG. 20B is a front view showing the configuration of the connecting component according to the second modification of the embodiment of the present disclosure.
Figure 20C:
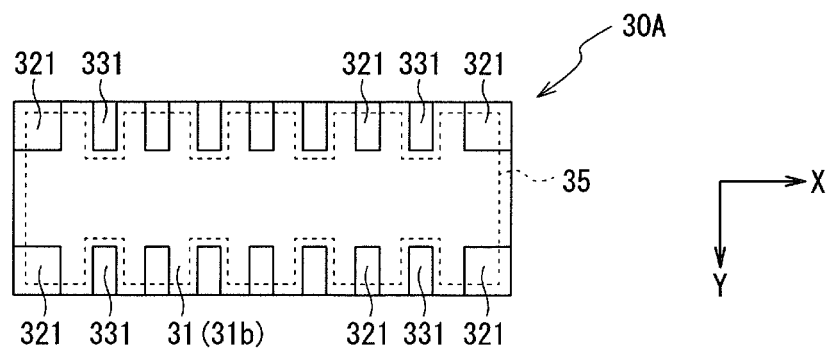
FIG. 20C is a bottom view showing the configuration of the connecting component according to the second modification of the embodiment of the present disclosure.
Figure 20D:
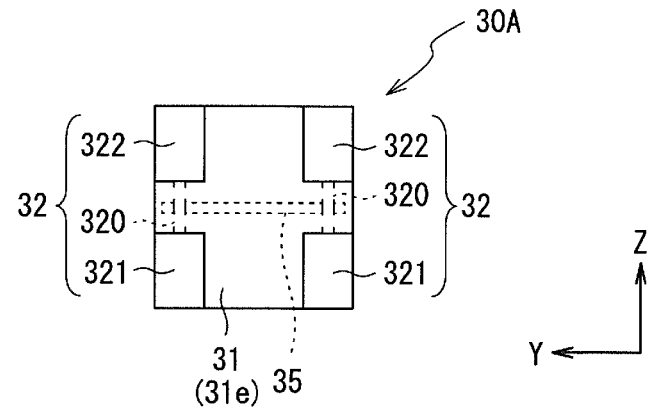
FIG. 20D is a left side view showing the configuration of the connecting component according to the second modification of the embodiment of the present disclosure.
Figure 20E:
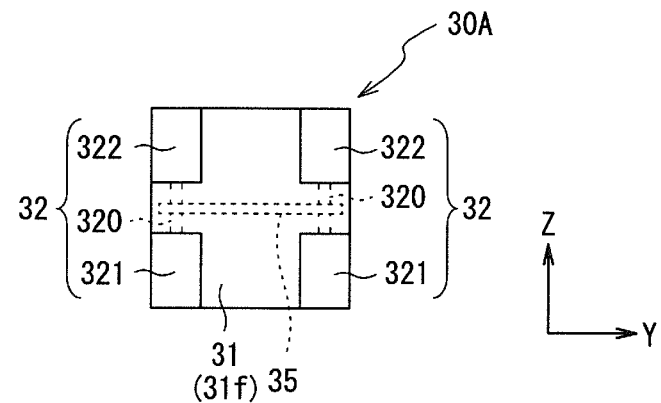
FIG. 20E is a right side view showing the configuration of the connecting component according to the second modification of the embodiment of the present disclosure.
Figure 20F:
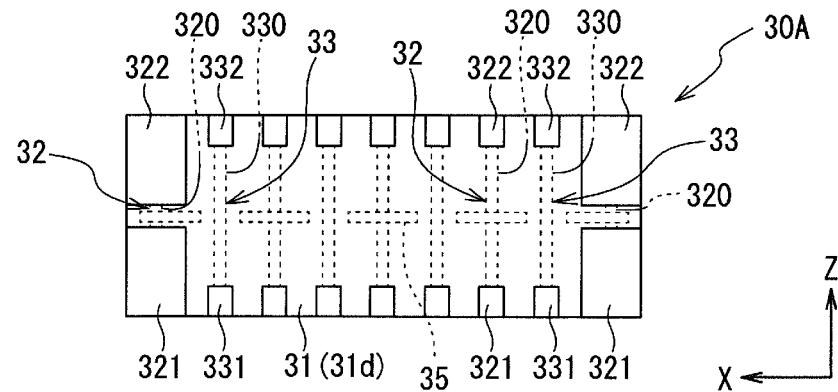
FIG. 20F is a rear view showing the configuration of the connecting component according to the second modification of the embodiment of the present disclosure.

FIG. 20A is a plan view showing a configuration of a connecting component according to a second modification of the embodiment of the present disclosure. FIG. 20B is a front view showing the configuration of the connecting component according to the second modification of the embodiment of the present disclosure. FIG. 20C is a bottom view showing the configuration of the connecting component according to the second modification of the embodiment of the present disclosure. FIG. 20D is a left side view showing the configuration of the connecting component according to the second modification of the embodiment of the present disclosure. FIG. 20E is a right side view showing the configuration of the connecting component according to the second modification of the embodiment of the present disclosure. FIG. 20F is a rear view showing the configuration of the connecting component according to the second modification of the embodiment of the present disclosure.

Figure 21:
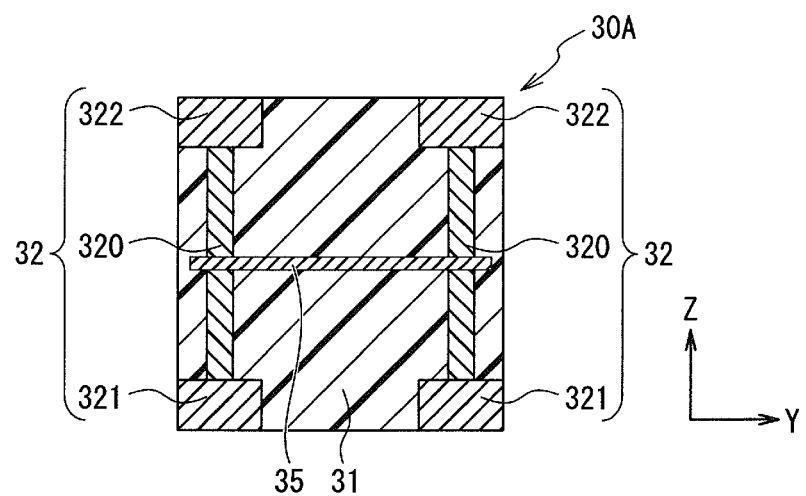
FIG. 21 is a sectional view of the plan view shown in FIG. 20A taken along line XXI-XXI'.
Figure 22:
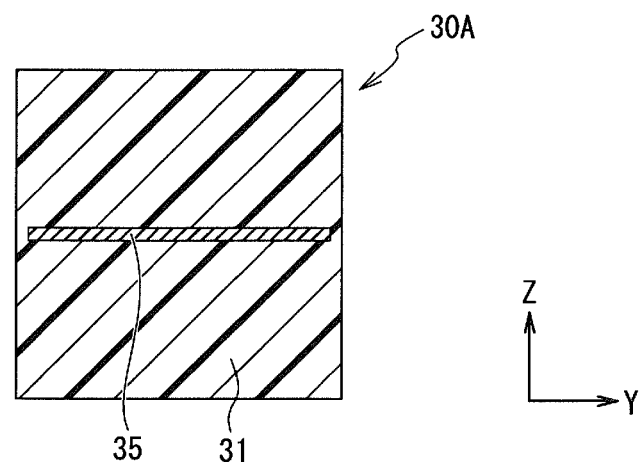
FIG. 22 is a sectional view of the plan view shown in FIG. 20A taken along line XXII-XXII'.
Figure 23:
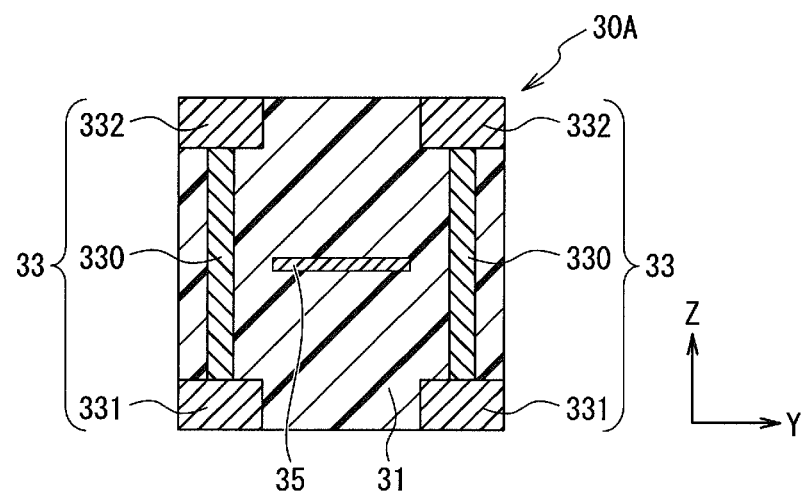
FIG. 23 is a sectional view of the plan view shown in FIG. 20A taken along line XXIII-XXIII'.
Figure 24:
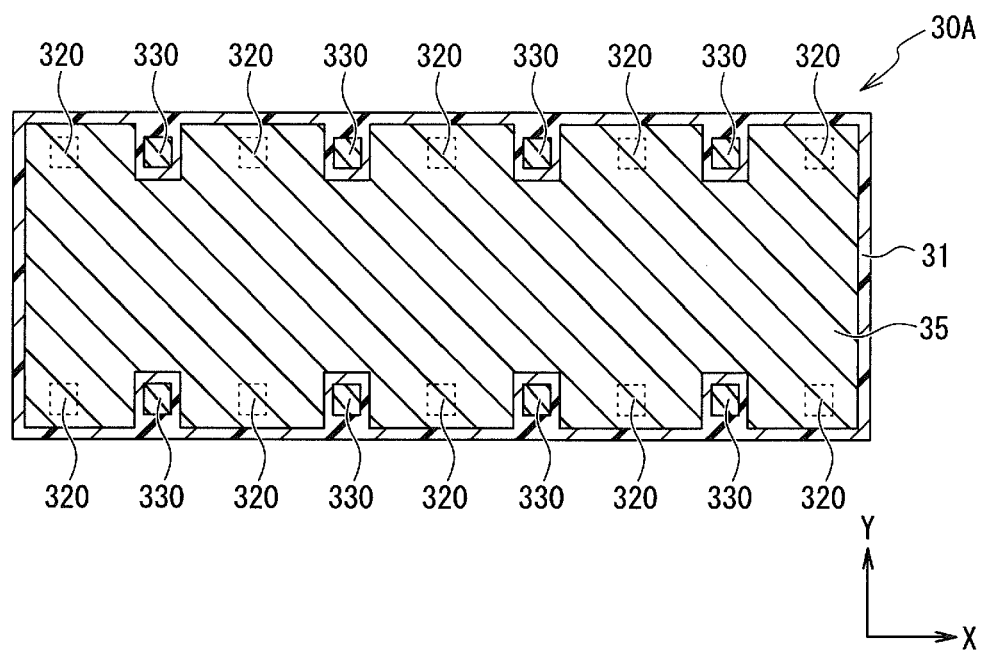
FIG. 24 is a sectional view of the front view shown in FIG. 20B taken along line XXIV-XXIV'.

FIG. 21 is a sectional view of the plan view shown in FIG. 20A taken along line XXI-XXI'. FIG. 21 shows a cross section of the base material 31 and potential wirings 32 taken along the Y-Z plane. FIG. 22 is a sectional view of the plan view shown in FIG. 20A taken along line XXII-XXII'. FIG. 22 shows a cross section of a portion positioned between a potential wiring 32 and a signal wiring 33 in the base material 31 taken along the Y-Z plane. FIG. 23 is a sectional view of the plan view shown in FIG. 20A taken along line XXIII-XXIII'. FIG. 23 shows a cross section of the base material 31 and the signal wiring 33 taken along the Y-Z plane. FIG. 24 is a sectional view of the front view shown in FIG. 20B taken along line XXIV-XXIV'. FIG. 24 shows a cross section of the base material 31, the potential wirings 32, and the signal wirings 33 taken along an X-Y plane.

As shown in FIGS. 20A to 24, a connecting component 30A according to the second modification of the embodiment of the present disclosure has a conductive layer 35 provided inside the base material 31. The conductive layer 35 is built into the connecting component 30A. The conductive layer 35 is connected to the potential wirings 32 but not to the signal wirings 33. The conductive layer 35 has a sheet-like shape that is parallel to the X-Y plane. The conductive layer 35 is constituted by a metal such as Cu. The conductive layer 35 is formed by being printed on a sheet-like substrate (for example, a green sheet) that constitutes the connecting component 30A during a process of manufacturing the connecting component 30A.

With the connecting component 30A according to the second modification of the embodiment, the conductive layer 35 can shield electromagnetic waves. For example, the conductive layer 35 can shield electromagnetic waves that penetrate to the base material 31 from the side of one of the upper surface 31a and the lower surface 31b of the base material 31 and propagate to the side of the other of the upper surface 31a and the lower surface 31b. Accordingly, the connecting component 30A is capable of further enhancing the shield function. In addition, since the conductive layer 35 is arranged inside the base material 31, compared to a case where the conductive layer 35 is arranged outside the base material 31, the possibility of the conductive layer 35 inadvertently coming into contact with an external member and becoming conductive or scratched or being exposed to outside atmosphere and becoming corroded can be reduced. It should be noted that, in the present embodiment, the conductive layer 35 may be provided outside the base material 31.

Third Modification

The conductive layer 35 has been explained as having a sheet shape that is parallel to the X-Y plane in the second modification described above. However, the present embodiment is not limited thereto. The conductive layer provided inside the base material 31 may have a sheet shape that is parallel to the X-Z plane.

Figure 25A:
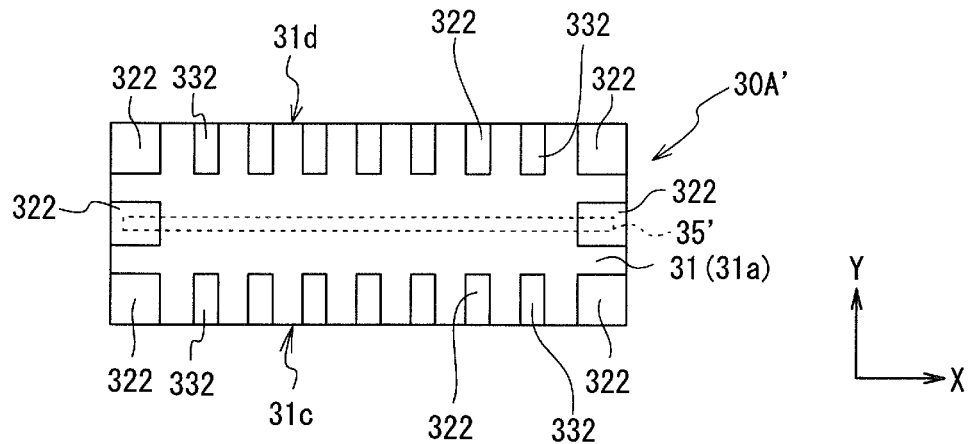
FIG. 25A is a plan view showing a configuration of a connecting component according to a third modification of the embodiment of the present disclosure.
Figure 25B:
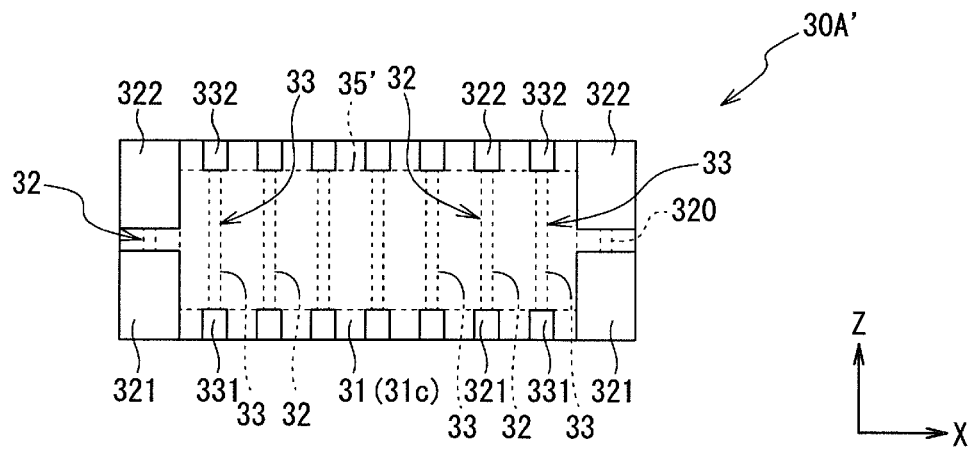
FIG. 25B is a front view showing the configuration of the connecting component according to the third modification of the embodiment of the present disclosure.
Figure 25C:
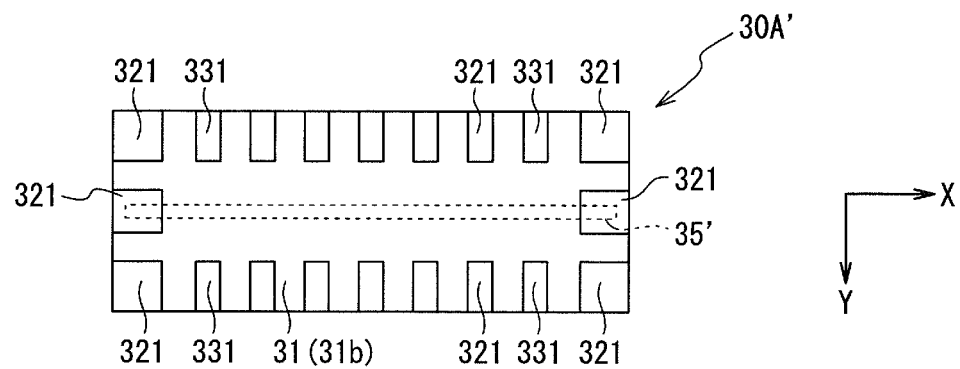
FIG. 25C is a bottom view showing the configuration of the connecting component according to the third modification of the embodiment of the present disclosure.
Figure 25D:
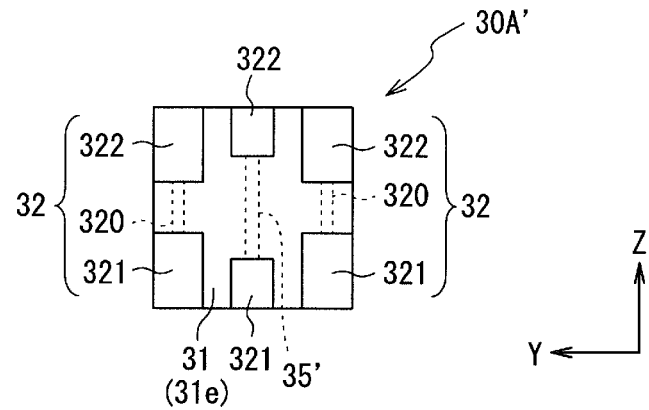
FIG. 25D is a left side view showing the configuration of the connecting component according to the third modification of the embodiment of the present disclosure.
Figure 25E:
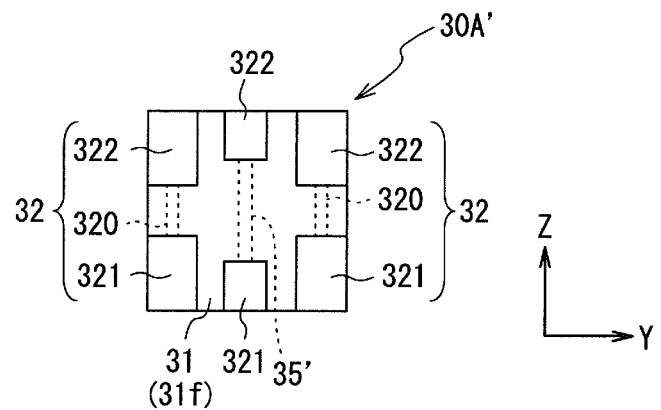
FIG. 25E is a right side view showing the configuration of the connecting component according to the third modification of the embodiment of the present disclosure.
Figure 25F:
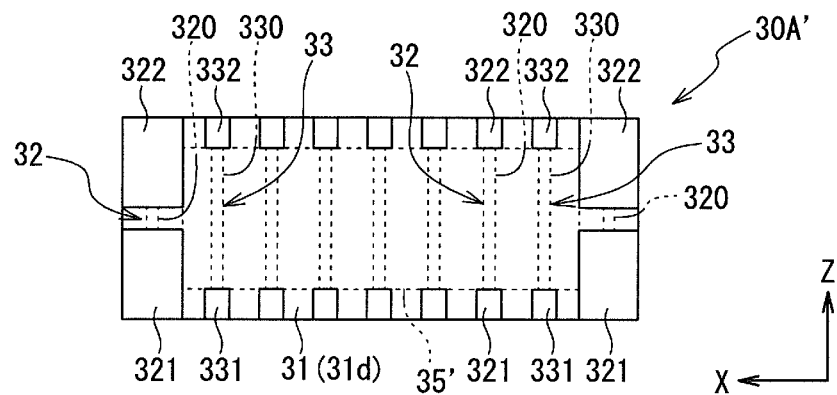
FIG. 25F is a rear view showing the configuration of the connecting component according to the third modification of the embodiment of the present disclosure.

FIG. 25A is a plan view showing a configuration of a connecting component according to a third modification of the embodiment of the present disclosure. FIG. 25B is a front view showing the configuration of the connecting component according to the third modification of the embodiment of the present disclosure. FIG. 25C is a bottom view showing the configuration of the connecting component according to the third modification of the embodiment of the present disclosure. FIG. 25D is a left side view showing the configuration of the connecting component according to the third modification of the embodiment of the present disclosure. FIG. 25E is a right side view showing the configuration of the connecting component according to the third modification of the embodiment of the present disclosure. FIG. 25F is a rear view showing the configuration of the connecting component according to the third modification of the embodiment of the present disclosure.

As shown in FIGS. 25A to 25F, a connecting component 30A according to the third modification of the embodiment of the present disclosure has a conductive layer 35' provided inside the base material 31. The conductive layer 35' is built into the connecting component 30A. The conductive layer 35' is connected to the potential wirings 32 (for example, the electrodes 321 and 322) but not to the signal wirings 33. The conductive layer 35' has a sheet-like shape that is parallel to the X-Z plane. The conductive layer 35' is constituted by a metal such as Cu. The conductive layer 35' is formed by being printed on a sheet-like substrate (for example, a green sheet) that constitutes the connecting component 30A' during a process of manufacturing the connecting component 30A.

With the connecting component 30A' according to the third modification of the embodiment, the conductive layer 35' can shield electromagnetic waves. For example, the conductive layer 35' can shield electromagnetic waves that penetrate to the base material 31 from the side of one of the front surface 31c and the rear surface 31d of the base material 31 and propagate to the side of the other of the front surface 31c and the rear surface 31d. Accordingly, the connecting component 30A' is capable of further enhancing the shield function. In addition, since the conductive layer 35' is arranged inside the base material 31, compared to a case where the conductive layer 35' is arranged outside the base material 31, the possibility of the conductive layer 35' inadvertently coming into contact with an external member and becoming conductive or scratched or being exposed to outside atmosphere and becoming corroded can be reduced. It should be noted that, in the present embodiment, the conductive layer 35' may be provided outside the base material 31.

Fourth Modification

The line width W32 of the potential wirings 32 that are built into the connecting component 30 and the line width W33 of the signal wirings 33 that are built into the connecting component 30 have been described as being a same length in the embodiment described above. However, the embodiment of the present disclosure is not limited thereto.

Figure 26:
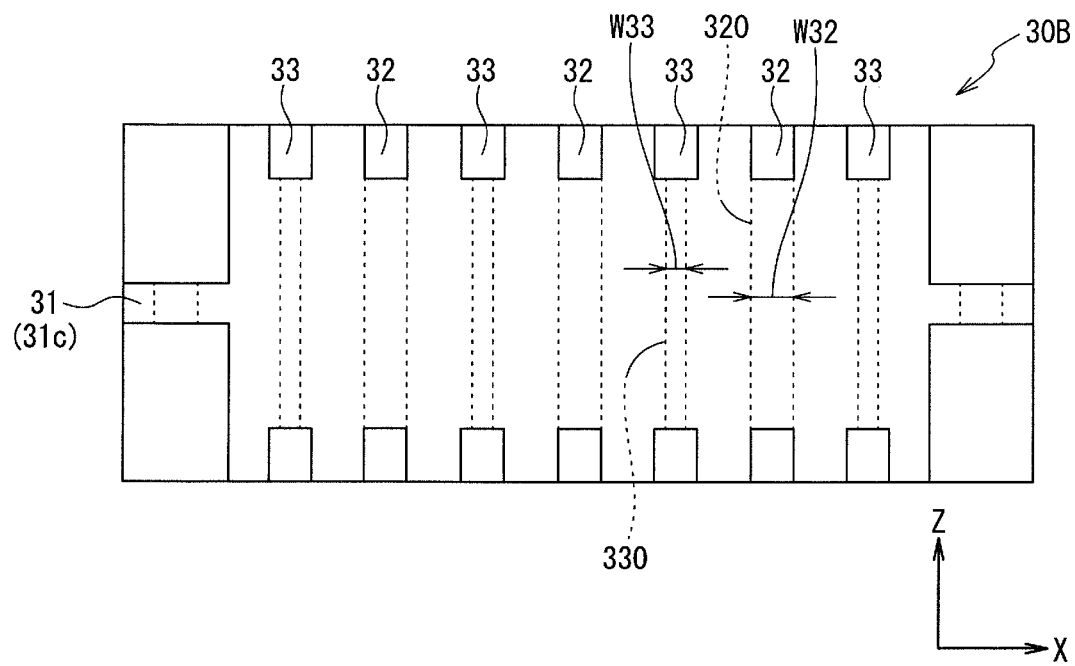
FIG. 26 is a front view showing a configuration of a connecting component according to a fourth modification of the embodiment of the present disclosure.

FIG. 26 is a front view showing a configuration of a connecting component according to a fourth modification of the embodiment of the present disclosure. As shown in FIG. 26, in a connecting component 30B according to the fourth modification of the embodiment, the line width W32 of the wiring main bodies 320 of the potential wirings 32 is wider than the line width W33 of the wiring main bodies 330 of the signal wirings 33 (W33<W32). Accordingly, compared to a case where W33≥W32, intervals of the potential wirings 32 to be connected to a fixed potential can be reduced. As a result, the potential wirings 32 can shield electromagnetic waves with higher frequencies.

Fifth Modification

The plurality of potential wirings 32 have been described as surrounding the mounting region R11 of the first substrate 10 in a plan view in the embodiment described above. However, the embodiment of the present disclosure is not limited thereto. In the embodiment of the present disclosure, the plurality of potential wirings 32 need not surround the mounting region R11 in a plan view.

Figure 27:
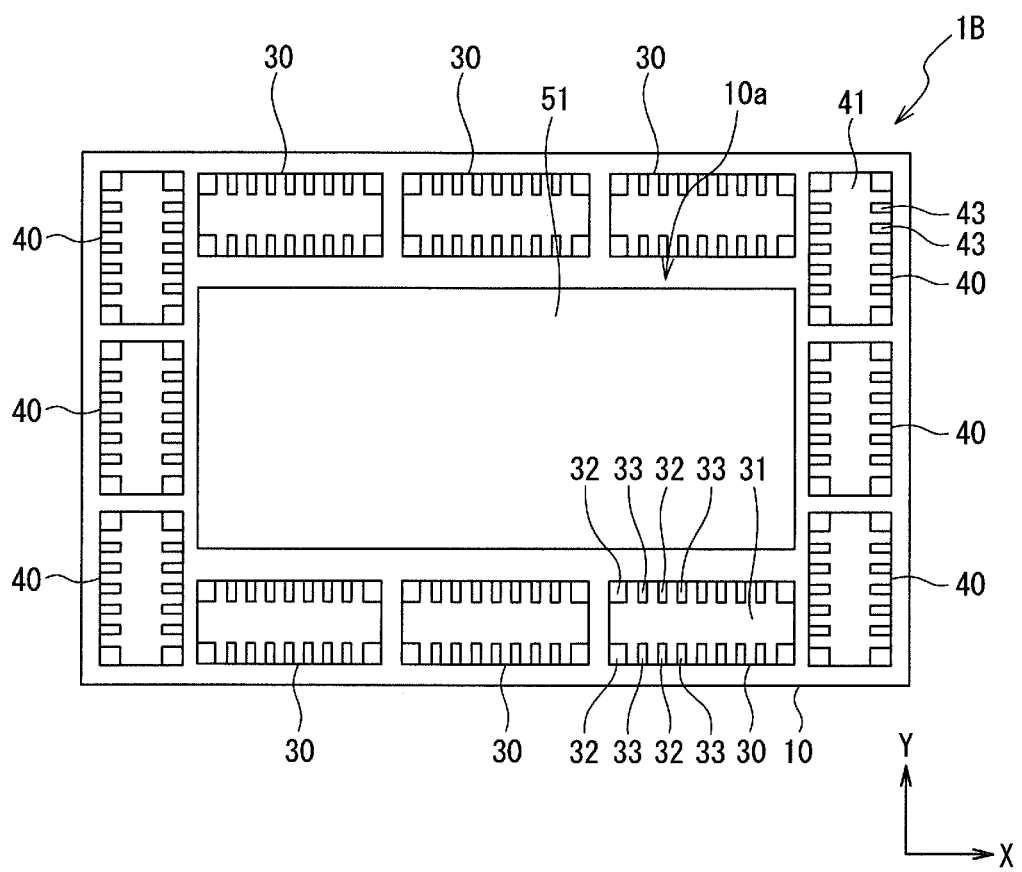
FIG. 27 is a plan view showing a configuration of an electronic device according to a fifth modification of the embodiment of the present disclosure.

FIG. 27 is a plan view showing a configuration of an electronic device according to a fifth modification of the embodiment of the present disclosure. As shown in FIG. 27, an electronic device 1B according to the fifth modification of the embodiment has connecting components 30 and 40 that are attached to the side of the upper surface 10a of the first substrate 10. For example, the connecting components 40 have a base material 41 and a plurality of signal wirings 43 provided inside the base material 41. The signal wirings 43 are the only wirings included in the connecting components 40. The connecting components 40 are not provided with potential wirings with an arbitrary potential.

In the electronic device 1B, a plurality of the connecting components 30 are arranged adjacent to a side of a part of the electronic component 51 that is mounted to the side of the upper surface 10a of the first substrate 10. For example, the electronic component 51 has a rectangular shape in a plan view. The plurality of connecting components 30 are arranged on a side of a long side of the electronic component 51. The connecting components 40 without potential wirings are arranged on a side of a short side of the electronic component 51.

Even with such a configuration, the connecting components 30 can prevent electromagnetic waves from penetrating to the side of the long side of the electronic component 51 from the outside. In addition, the connecting components 30 can prevent electromagnetic waves from leaking to the outside from the side of the long side of the electronic component 51. For example, the mode shown in the fifth modification is preferable when a circuit with relatively low noise resistance is present on the side of the long side of the electronic component 51 or when a noise generation source is present on the side of the long side of the electronic component 51. Furthermore, the mode shown in the fifth modification is also preferable when providing the shield function and realizing downsizing while requiring a larger number of signal wirings.

Sixth Modification

The first substrate 10 and the second substrate 20 have respectively been explained as being a build-up substrate in the embodiment described above. However, the embodiment of the present disclosure is not limited thereto. In the embodiment of the present disclosure, at least a part of the substrate may be a flexible substrate.

Figure 28:
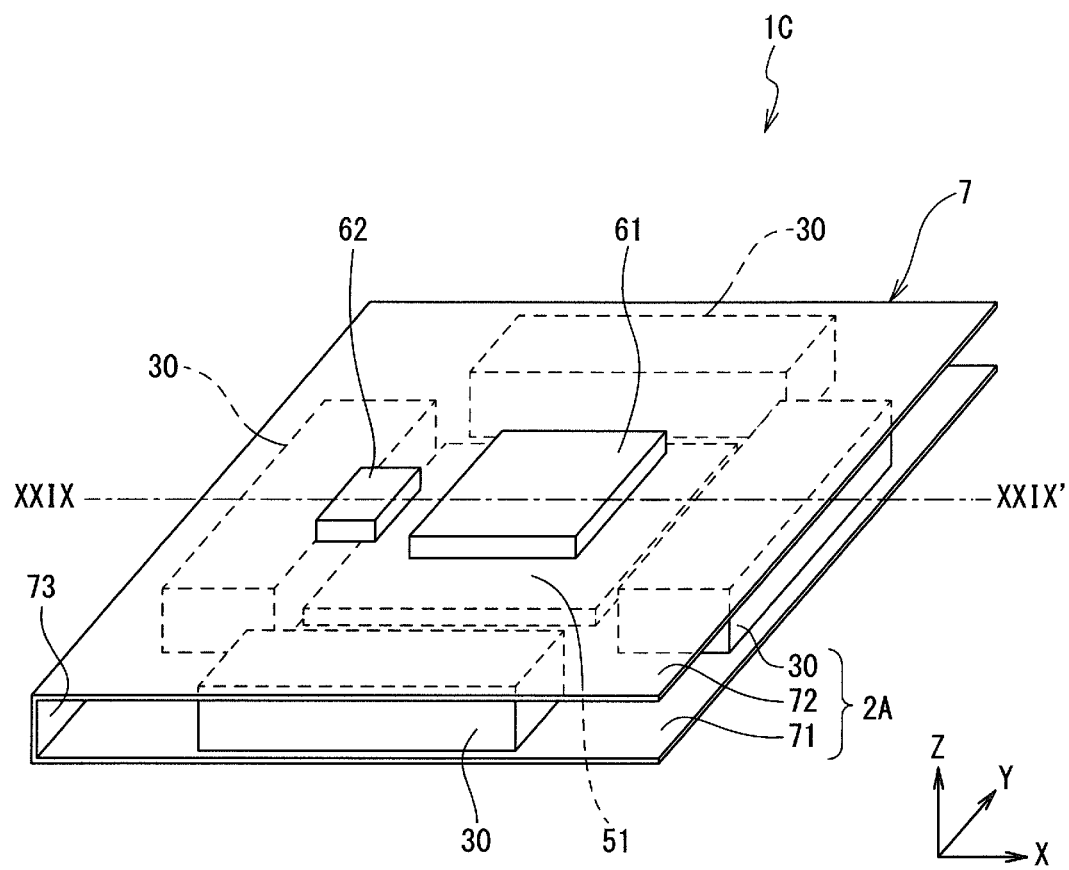
FIG. 28 is a perspective view showing a configuration of an electronic device according to a sixth modification of the embodiment of the present disclosure.
Figure 29:
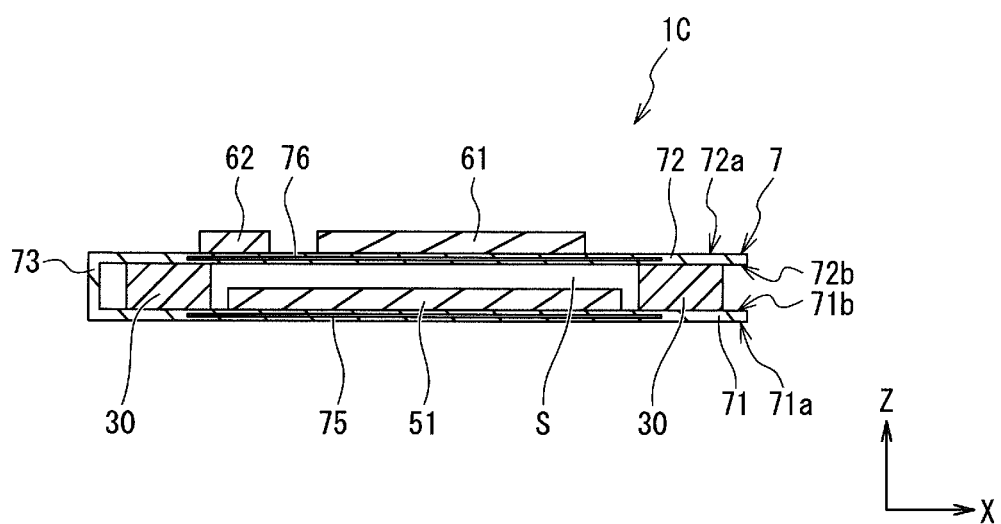
FIG. 29 is a sectional view showing the configuration of the electronic device according to the sixth modification of the embodiment of the present disclosure.

FIG. 28 is a perspective view showing a configuration of an electronic device according to a sixth modification of the embodiment. FIG. 29 is a sectional view showing a configuration of the electronic device according to the sixth modification of the present disclosure. FIG. 29 shows a cross section of FIG. 28 taken along the X-Z plane that passes through a line XXIX-XXIX'. As shown in FIGS. 28 and 29, an electronic device 1C according to the sixth modification includes a flexible substrate 7 (an example of the substrate), a plurality of connecting components 30 that are mounted to the flexible substrate 7, and electronic components 51, 61, and 62 that are mounted to the flexible substrate 7. The electronic device 1C can be called a module.

The flexible substrate 7 has a structure in which a wiring pattern that is a patterned wiring layer and an insulating layer are respectively stacked in plurality on a side of at least one surface of a flexible resin sheet. The insulating layers are provided with a via. A wiring pattern on an upper side of an insulating layer and a wiring pattern on a lower side of the insulating layer are connected through the via. The wiring patterns and the insulating layers may also be alternately arranged inside the resin sheet. An insulator constituting the resin sheet is polyimide. A conductor constituting the wiring patterns is Cu or a Cu alloy having Cu as a main component. In addition, the flexible substrate 7 has a protective film with insulation properties on both surfaces (a surface on a front side and a surface on a rear side) thereof. The protective film is a solder resist or a coverlay.

The flexible substrate 7 has a first substrate portion 71, a second substrate portion 72, and a connecting part 73 that connects the first substrate portion 71 and the second substrate portion 72 to each other. In the flexible substrate 7, a boundary between the first substrate portion 71 and the connecting part 73 and a boundary between the second substrate portion 72 and the connecting part 73 are respectively bent so that the first substrate portion 71 and the second substrate portion 72 face each other. Hereinafter, a state where the flexible substrate 7 is bent near the connecting part 73 so that the first substrate portion 71 and the second substrate portion 72 face each other will be referred to as a bent state. In addition, in the bent state, a surface that faces an outer side of the flexible substrate 7 will be referred to as an outer surface and a surface that faces an inner side of the flexible substrate 7 will be referred to as an inner surface.

The first substrate portion 71 has an outer surface 71a and an inner surface 71b. The second substrate portion 72 has an outer surface 72a and an inner surface 72b. In the bent state, the inner surface 71b of the first substrate portion 71 and the inner surface 72b of the second substrate portion 72 face each other via a space S.

The plurality of connecting components 30 are arranged between the first substrate portion 71 and the second substrate portion 72. Each of the plurality of connecting components 30 is surface-mounted to a side of the inner surface 71b of the first substrate portion 71 and a side of the inner surface 72b of the second substrate portion 72. Each of the plurality of connecting components 30 is attached to both the first substrate portion 71 and the second substrate portion 72 and fixed from a vertical direction.

As shown in FIG. 29, the electronic component 51 is surface-mounted to a mounting region of the electronic component 51 on a side of the inner surface 71b of the first substrate portion 71. In the bent state, the electronic component 51 is arranged between the first substrate portion 71 and the second substrate portion 72. Since the electronic component 51 is thinner than the connecting components 30, the electronic component 51 does not come into contact with the second substrate portion 72. A gap exists between an upper surface of the electronic component 51 and the inner surface 72b of the second substrate portion 72. The electronic components 61 and 62 are surface-mounted to mounting regions of the electronic components 61 and 62 on a side of the outer surface 72a of the second substrate portion 72.

The first substrate portion 71 is provided with a first conductive layer 75. For example, the first conductive layer 75 is provided inside the first substrate portion 71. In a thickness direction of the first substrate portion 71 (for example, the Z-axis direction), the first conductive layer 75 is provided at a position that overlaps with at least a part of the electronic component 5 (or a mounting region of the electronic component 5). In addition, the second substrate portion 72 is provided with a second conductive layer 76. For example, the second conductive layer 76 is provided inside the second substrate portion 72. In a direction in which the second substrate portion 72 and the first substrate portion 71 face each other (for example, the Z-axis direction), the second conductive layer 76 is provided at a position that overlaps with at least a part of the electronic component 51 (or a mounting region of the electronic component 51) when the flexible substrate 7 is in the bent state.

The first conductive layer 75 and the second conductive layer 76 respectively have a rectangular shape in a plan view. The first conductive layer 75 and the second conductive layer 76 may be conductive sheets without an opening or may be mesh-like conductive sheets. The first conductive layer 75 and the second conductive layer 76 are constituted by, for example, Cu or a Cu alloy. The electronic component 51 is surrounded by the plurality of potential wirings 32, the first conductive layer 75, and the second conductive layer 76. In a similar manner to the first modification, the first conductive layer 75 and the second conductive layer 76 are electrically connected to the potential wirings 32 and function as a shield that shields electromagnetic waves.

In the electronic device 1C according to the sixth modification, the first substrate portion 71 and the second substrate portion 72 are connected to each other by the connecting components 30 to construct a circuit board 2A. The circuit board 2A may be referred to as a three-dimensional circuit pattern. Using the flexible substrate 7 enables a thickness of the circuit board 2A to be reduced. Accordingly, thinning of the electronic device 1C can be realized.

When bending a single flexible substrate 7, a force to restore the flexible substrate 7 to its state prior to bending is created. Since this force has a spring property (elasticity), solder connecting parts (for example, the electrodes 321, 322, 331, and 332 shown in FIG. 3) of the connecting components 30 are subjected to a force in a tensile direction. When this force is continuously applied to the solder connecting parts, there is a possibility that the solder connecting parts may be destroyed and long-term reliability of the electronic device 1C may decline. In consideration thereof, in the sixth modification, the number of connecting components 30 may be increased to disperse a load in the tensile direction. For example, a larger number of the connecting components 30 may be arranged at a location where a force in the tensile direction occurs strongly (for example, near the connecting part 73). Accordingly, since the force applied to each solder connecting part can be reduced, a decline in the long-term reliability of the electronic device 1C can be prevented.

In addition, in the sixth modification, in order to prevent a decline in long-term reliability, resin may be injected into a space between bent flexible substrates 7 to bond and cure surfaces of the flexible substrates 7 that face each other. For example, in FIG. 29, resin may be injected into a space S between the inner surface 71b of the first substrate portion 71 and the inner surface 72b of the second substrate portion 72 and the inner surfaces 71b and 72b may be bonded to each other and cured. Accordingly, since the force applied to each solder connecting part can be reduced, a decline in the long-term reliability of the electronic device 1C can be prevented.

It should be noted that the substrate 7 included in the electronic device 1C may be constituted by a plurality of flexible substrates instead of a single flexible substrate. For example, the first substrate portion 71 may be constituted by a first flexible substrate, the second substrate portion 72 may be constituted by a second flexible substrate, and the first flexible substrate and the second flexible substrate may be electrically connected via the connecting components 30.

In addition, the substrate included in the electronic device 1C may be a rigid flexible substrate. For example, one of the first substrate portion 71 and the second substrate portion 72 may be a flexible substrate and the other may be a rigid substrate. Alternatively, both the first substrate portion 71 and the second substrate portion 72 may be a rigid substrate and the connecting part 73 may be a flexible substrate.

Other Embodiments

While the present disclosure has been described above in the form of an embodiment and modifications, it is not to be understood that the descriptions and drawings that constitute parts of the present disclosure limit the disclosure. It is to be understood that various alternative embodiments, examples, and operable techniques will become apparent from the disclosure to those skilled in the art.

For example, in the embodiment described above, the plurality of potential wirings 32 and the plurality of signal wirings 33 have been explained as being arranged so as to alternately line up in one direction in the connecting components 30. However, in the embodiment of the present disclosure, an arrangement of the potential wirings 32 and the signal wirings 33 is not limited thereto. For example, two or more signal wirings 33 may be arranged between a pair of potential wirings 32 that are adjacent to each other in one direction. In addition, two or more potential wirings 32 may be arranged between a pair of signal wirings 33 that are adjacent to each other in one direction. Alternatively, in the connecting components 30, there may exist a row of potential wirings in which only the plurality of potential wirings 32 line up in one direction and a row of signal wirings in which only the plurality of signal wirings 33 line up in one direction. Even with such a configuration, the plurality of potential wirings 32 function as a shield that shields electromagnetic waves.

In addition, in the embodiment described above, the connecting components 30 have been explained as being manufactured by forming a stacked body by stacking a plurality of ceramic green sheets and baking the formed stacked body. However, a manufacturing method of the connecting components 30 in the embodiment of the present disclosure is not limited thereto. The base material 31 constituting the connecting components 30 may be made of a resin with insulating properties instead of a ceramic. Even with such a configuration, the connecting components 30 can incorporate the plurality of potential wirings 32 and the plurality of signal wirings 33. In addition, the connecting components 30 can be given a desired shape (for example, a rectangular parallelepiped shape).

Furthermore, in the embodiment of the present disclosure, the connecting components may be structured without a base material. A spacer may be arranged separately from a connecting component between the first substrate 10 and the second substrate 20. The first substrate 10 and the second substrate 20 may be held by the spacer in a state where the first substrate 10 and the second substrate 20 are separated from each other. Even in such a case, the plurality of potential wirings 32 function as a shield that shields electromagnetic waves.

As described above, the present technique obviously includes various embodiments and the like that are not described herein. At least one of various omissions, replacements, and modifications of the components can be performed without departing from the gist of the embodiment and the respective modifications described above. In addition, the advantageous effects described in the present specification are merely exemplary and are not restrictive, and other advantageous effects may be produced. The technical scope of the present disclosure is to be determined solely by matters specifying the invention according to the scope of claims that are reasonable from the description presented above.

The present disclosure can also be configured as follows.

(1) An electronic device, including:
a substrate having a first substrate portion and a second substrate portion that is arranged at a position facing the first substrate portion;
a plurality of potential wirings which are connected to the first substrate portion and to the second substrate portion and which have an arbitrary potential; and
a plurality of signal wirings which are connected to the first substrate portion and to the second substrate portion and to which a signal is supplied, wherein
the first substrate portion has a mounting region of an electronic component on a side of a surface facing the second substrate portion.

(2) The electronic device according to (1), wherein the plurality of potential wirings are arranged on an outer side of the mounting region so as to surround at least a part of the mounting region.

(3) The electronic device according to (1) or (2), further including an electronic component to be mounted to the mounting region.

(4) The electronic device according to any one of (1) to (3), wherein the plurality of potential wirings are arranged adjacent to the mounting region.

(5) The electronic device according to any one of (1) to (4), further including
a connecting component that is arranged between the first substrate portion and the second substrate portion, wherein the connecting component has a base material with insulating properties, and
the plurality of potential wirings and the plurality of signal wirings are arranged inside the base material.
(6) The electronic device according to (5), wherein
the connecting component further includes a conductive layer that is provided inside the base material, and
the conductive layer is connected to the potential wirings.
(7) The electronic device according to any one of (1) to (6), wherein a line width of the potential wirings is wider than a line width of the signal wirings.
(8) The electronic device according to any one of (1) to (7), further including a first conductive layer that is provided in the first substrate portion, wherein the first conductive layer is connected to the potential wirings.
(9) The electronic device according to any one of (1) to (8), further including a second conductive layer that is provided in the second substrate portion, wherein the second conductive layer is connected to the potential wirings.
(10) The electronic device according to any one of (1) to (9), wherein at least one of the first substrate portion and the second substrate portion is a rigid substrate.
(11) The electronic device according to any one of (1) to (9), wherein at least a part of the substrate is a flexible substrate.
(12) A connecting component to be arranged between a first substrate portion and a second substrate portion that face each other, the connecting component including:
a base material having a first surface and a second surface that is arranged on a side opposite to the first surface;
a plurality of potential wirings which are provided inside the base material and which have an arbitrary potential; and
a plurality of signal wirings which are provided inside the base material and to which a signal is supplied, wherein
one end of the potential wirings and one end of the signal wirings are respectively exposed from the first surface and another end of the potential wirings and another end of the signal wirings are respectively exposed from the second surface.
(13) The connecting component according to (11), further including
a conductive layer that is provided inside the base material, wherein the conductive layer is connected to the potential wirings.
(14) The connecting component according to (11) or (12), wherein a line width of the potential wirings is wider than a line width of the signal wirings.

REFERENCE SIGNS LIST 1, 1A, 1B, 1C Electronic device (module)
2, 2A Circuit board (three-dimensional circuit pattern)
7 Flexible substrate
10 First substrate
10a, 20a, 31a, 301a Upper surface
10b, 20b, 31b, 302b Lower surface
11, 12 Land
15 First conductive layer
20 Second substrate
25 Second conductive layer
30, 30A, 30B, 40 Connecting component
31, 41 Base material
31c Front surface
31d Rear surface
31e Left side surface
31f Right side surface
32 Potential wiring
32-1 First potential wiring
32-2 Second potential wiring
32-3 Third potential wiring
33, 43 Signal wiring
33-1 First signal wiring
33-2 Second signal wiring
33-3 Third signal wiring
35 Conductive layer
51, 52, 53 Electronic component
71 First substrate portion
71a, 72a Outer surface
71b, 72b Inner surface
72 Second substrate portion
73 Connecting part
75 First conductive layer
76 Second conductive layer
61, 62, 63 Electronic component
90 Cover
301 Lower component
302 Upper component
320 Wiring main body
321, 322, 331, 332 Electrode
330 Wiring main body
P11, P12, P21, P22 Distance
R11 Mounting region
R31, R32 Attachment region
W32, W33 Line width

The invention claimed is:
1. An electronic device, comprising:
a substrate having a first substrate portion and a second substrate portion, wherein the second substrate portion is at a position facing the first substrate portion;
a connecting component between the first substrate portion and the second substrate portion, wherein the connecting component has a plurality of surfaces;
a plurality of potential wirings connected to the first substrate portion and the second substrate portion, wherein
the plurality of potential wirings has an arbitrary potential,
the plurality of potential wirings includes a plurality of electrodes,
an electrode of the plurality of electrodes is at a corner of the connecting component, and
the electrode is exposed from three surfaces of the plurality of surfaces; and
a plurality of signal wirings connected to the first substrate portion and the second substrate portion, wherein
the plurality of signal wirings is configured to receive a specific signal,
the first substrate portion has a mounting region of an electronic component on a side of a surface of the first substrate portion, and
the surface of the first substrate portion faces the second substrate portion.
2. The electronic device according to claim 1, wherein the plurality of potential wirings is on an outer side of the mounting region so as to surround at least a part of the mounting region.
3. The electronic device according to claim 1, further comprising the electronic component mountable on the mounting region.

4. The electronic device according to claim 1, wherein the plurality of potential wirings is adjacent to the mounting region.

5. The electronic device according to claim 1, wherein
the connecting component includes a base material with insulating properties, and
the plurality of potential wirings and the plurality of signal wirings are inside the base material.

6. The electronic device according to claim 5, wherein
the connecting component further includes a conductive layer inside the base material, and
the conductive layer is connected to the plurality of potential wirings.

7. The electronic device according to claim 1, wherein a line width of each potential wiring of the plurality of potential wirings is wider than a line width of each signal wiring of the plurality of signal wirings.

8. The electronic device according to claim 1, further comprising a first conductive layer in the first substrate portion, wherein the first conductive layer is connected to the plurality of potential wirings.

9. The electronic device according to claim 1, further comprising a second conductive layer in the second substrate portion, wherein the second conductive layer is connected to the plurality of potential wirings.

10. The electronic device according to claim 1, wherein at least one of the first substrate portion or the second substrate portion is a rigid substrate.

11. The electronic device according to claim 1, wherein at least a part of the substrate is a flexible substrate.

12. The electronic device according to claim 1, wherein a line width of each potential wiring of the plurality of potential wirings is 90 µm or more and 110 µm or less.

13. The electronic device according to claim 1, wherein
the plurality of potential wirings includes a first potential wiring and a second potential wiring, and
a distance between the first potential wiring and the second potential wiring is 490 µm or more and 510 µm or less.

14. A connecting component, comprising:
a base material having a plurality of surfaces, wherein
the plurality of surfaces includes at least a first surface and a second surface,
the second surface is opposite to the first surface,
the connecting component is to be arranged between a first substrate portion and a second substrate portion that faces the first substrate portion;
a plurality of potential wirings inside the base material, wherein
the plurality of potential wirings has an arbitrary potential,
the plurality of potential wirings includes a plurality of electrodes,
an electrode of the plurality of electrodes is at a corner of the base material, and
the electrode is exposed from three surfaces of the plurality of surfaces; and
a plurality of signal wirings inside the base material, wherein
the plurality of signal wirings is configured to receive a specific signal,
a first end of the plurality of potential wirings and a first end of the plurality of signal wirings are respectively exposed from the first surface, and
a second end of the plurality of potential wirings and a second end of the plurality of signal wirings are respectively exposed from the second surface.

* * * * *